United States Patent [19]

Hosotani et al.

[11] Patent Number: 5,160,930
[45] Date of Patent: Nov. 3, 1992

[54] REFERENCE VOLTAGE GENERATING CIRCUIT, AND A/D AND D/A CONVERTERS USING THE SAME

[75] Inventors: Shiro Hosotani; Takahiro Miki, both of Hyogo, Japan

[73] Assignee: Mitsubishi Denki Kabushiki Kaisha, Tokyo, Japan

[21] Appl. No.: 665,856

[22] Filed: Mar. 7, 1991

[30] Foreign Application Priority Data

Apr. 18, 1990 [JP] Japan .................................. 2-104306

[51] Int. Cl.$^5$ ............................................ H03M 1/00
[52] U.S. Cl. .................................. 341/154; 341/155; 341/158; 341/144
[58] Field of Search ............... 341/144, 154, 155, 156, 341/158, 159

[56] References Cited

U.S. PATENT DOCUMENTS

| | | | |
|---|---|---|---|
| 4,496,935 | 1/1985 | Inoue et al. ..................... | 341/159 X |
| 4,612,531 | 9/1986 | Dingwall et al. .................. | 341/156 |
| 4,804,940 | 2/1989 | Takigawa et al. ............... | 341/154 X |
| 4,990,917 | 2/1991 | Kohdaka ........................... | 341/159 |
| 5,021,785 | 6/1991 | Kohdaka et al. ................. | 341/154 X |

FOREIGN PATENT DOCUMENTS

| | | |
|---|---|---|
| 6196811 | 10/1984 | Japan . |
| 61-189022 | 2/1986 | Japan . |
| 63-287114 | 11/1988 | Japan .................................. 341/154 |
| 2170968 | 2/1986 | United Kingdom . |

OTHER PUBLICATIONS

1985 Digest of Technical Papers, IEEE International Solid State Circuits Conference Feb. 13, 1985, pp. 72-73, 308, 309.

Primary Examiner—Howard L. Williams
Attorney, Agent, or Firm—Lowe, Price, LeBlanc & Becker

[57] ABSTRACT

A reference voltage generating circuit is disclosed which generates a plurality of linear analog voltages and is desirably applied to A/D and D/A converters. As the reference voltage generating circuit itself or a resistor network comprised therein, a resistor network is employed which comprises a plurality of resistor elements connected in series between two power sources and resistor networks (or resistor elements) connected to all the other nodes than the two nodes closest to the two power sources, respectively, out of the nodes between the former resistor elements. The above-mentioned plurality of resistor elements have the same resistance value r and the output impedance (or resistance value) of the resistor networks (or resistor elements) connected to all the nodes above is set to a value twice the resistance value r of the above-mentioned resistor elements, or 2r. Accordingly, output impedance at any of the nodes between said plurality of resistor elements represents 2·r/3. A a result, inequality of output impedances between the output terminals of the reference voltage generating circuit can be improved.

30 Claims, 12 Drawing Sheets

REFERENCE VOLTAGE GENERATING CIRCUIT, AND A/D AND D/A CONVERTERS USING THE SAME

BACKGROUND OF THE INVENTION

1. Field of the Invention

The present invention generally relates to reference voltage generating circuits and A/D and D/A converters using the same. More particularly, the present invention relates to a reference voltage generating circuit which generates a plurality of linear voltages and A/D and D/A converters using the same.

2. Description of the Background Art

The A/D and D/A converters are provided with a reference voltage generating circuit which generates a plurality of different voltages.

The A/D converters compare analog voltages to be digitized with each of the plurality of analog voltages generated by the reference voltage generating circuit, thereby converting the analog voltages into binary data having a predetermined number of bits.

Conversely, the D/A converters select and output, according to a digital signal to be converted into an analog signal, one of the plurality of analog voltages generated by the reference voltage generating circuit, thereby converting the digital signal into an analog signal.

FIG. 8 is a schematic block diagram showing an A/D converter.

Referring to FIG. 8, the A/D converter comprises a reference voltage generating circuit RVG provided between reference voltage receiving terminals 2 and 3, an encoder ENC, and a comparing portion CMPG provided between reference voltage generating circuit RVG and encoder ENC. Reference voltage receiving terminals 2 and 3 receive constant voltages of different magnitudes.

Reference voltage generating circuit RVG equally divides a difference voltage between voltages received at reference voltage receiving terminals 2 and 3 to output a predetermined number of voltages to output terminals T1 to T(l−1) (l=2, 3, . . .).

Comparing portion CMPG comprises (l−1) comparators CMP. Each of the (l−1) comparators CMP is provided to correspond to one of (l−1) output terminals T1 to T(l−1). Each comparator CMP compares an analog voltage received from a corresponding output terminal of reference voltage generating circuit RVG with an analog voltage input from another analog voltage receiving terminal 1 to output a voltage of "H" or "L" level according to the comparison result. The terminal 1 receives an analog voltage which is to be converted into digital data. Therefore, the output signals of comparing portion CMPG indicate to which voltage range the analog voltage belongs, out of l voltage ranges defined by l−1 output voltages of reference voltage generating circuit RVG.

For example, in a case that voltages output through terminals T1 to T (l−1) of reference voltage generating circuit RVG become higher as the terminal number increases, when an analog voltage received at terminal 1 is higher than a voltage derived from terminal T(l−2), all the comparators CMP provided corresponding to output terminals T1 to T(l−2) outputs the same logical level, which is the inverse of that output from the comparator CMP provided corresponding to output terminal T(l−1). Thus, since the logical level of outputs is switched from a certain comparator, the analog voltage is identified as having a magnitude belonging to any of the l voltage ranges.

In the manner described above, the analog voltage applied to terminal 1 is compared with each of the plurality of voltages output from reference voltage generating circuit RVG so as to be converted into digital data.

Encoder ENC encodes the digital output from comparing portion CMPG into binary data of N bits indicative of magnitude of the analog voltage and outputs the encoded signal to digital signal output terminals D1 to DN.

Subsequently, structures of reference voltage generating circuit RVG and comparators CMP will be described. FIGS. 9 and 10 are circuit diagrams showing the structures of reference voltage generating circuit RVG and comparator CMP, respectively, in the A/D converter disclosed in Japanese Patent Laying-Open No. 61-189022.

Referring to FIG. 9, reference voltage generating circuit RGV comprises a main resistor network MR and a sub-resistor network SR.

Main resistor network MR comprises m (m is arbitrary natural number) resistor networks RG1 to RGm connected in series between reference voltage receiving terminals 2 and 3. Each of resistor networks RG1 to RGm is comprised of a series connection of n (n is arbitrary natural number) resistors having the same resistance value r. Meanwhile, in the diagram, each of resistor networks RG1 to RGm is equivalently shown as a single resistor having a resistance value n×r.

Sub-resistor network comprises m resistors R1 to Rm connected in series between reference voltage receiving terminals 2 and 3 and having the same resistance value R.

The (m−1) nodes between resistors R1 to Rm constituting sub-resistor network SR are connected to the (m−1) nodes between resistor networks RG1 to RGm constituting main resistor network MR in a one-to-one correspondence. Therefore, a difference voltage between voltages applied to reference voltage receiving terminals 2 and 3 is divided by m resistors R1 to Rm in sub-resistor network SR and applied to main resistor network MR. Each of thus divided voltages is further divided by n resistors r1 to rn constituting each of respective resistor networks RG1 to RGm in main resistor network MR. As a result, voltages of different levels within a range lower than the voltage applied to reference voltage receiving terminal 2 and higher than the voltage applied to reference voltage receiving terminal 3 are derived from nodes A(1, 1) to A(1, n−1), A(2, 1) to A(2, n−1) . . . , A(m, 1) to A(m, n−1) between resistors r1 to rn constituting the respective resistor networks RG1 to Rgm and from nodes A(1, n) to A(m−1, n) between resistor networks RG1 to Rgm. The relationship between these voltages is linear.

Potentials at the above-mentioned nodes A(1, 1) to A(1, n), . . . , A(m, 1) to A(m, n−1) are derived from output terminals T1 to T(l−1) in FIG. 8 (where l=m·n).

Referring to FIG. 10, comparator CMP comprises a coupling capacitor 8, an output terminal 7, a parallel connection circuit of a switch SW3 and an inverting amplifier 9 provided between output terminal 7 and coupling capacitor 8, and switches SW1 and SW2 provided between coupling capacitor 8, and analog voltage receiving terminal 1 and a corresponding output terminal Tj (j=1, 2, ..., m·n−1) of reference voltage generating circuit RVG in FIG. 8, respectively. Switches SW1 and SW3 are controlled by an externally applied control signal $\phi$ and switch SW2 is controlled by an inverted signal $\bar{\phi}$ of the control signal $\phi$. Accordingly, switches SW1 and SW3 and switch SW2 are complementarily turned on/off.

In the following, operation of the comparator will be described.

The control signal $\phi$ first attains and remains at a logical level "H" corresponding to a logical value "1" for a predetermined period and then switched to a logical level "L" corresponding to a logical value "0". All the switches SW1 to SW3 are put in the ON state by the externally applied control voltage of the "H" level, and in the OFF state by the externally applied control voltage of the "L" level. Therefore, during the period in which control signal $\phi$ represents the voltage level corresponding to the logical value "1", switches SW1 and SW3 are in the ON state while switch SW2 is in the OFF state. When switch SW3 is turned on, inverting amplifier 9 is short-circuited between input and output so that its input and output potentials are equalized. At this time, the potentials at the input and output terminals of inverting amplifier 9 change to a certain potential Vb (generally about Vdd/2, with Vdd representing drive voltage of inverting amplifier 9) which is determined by transfer characteristics of inverting amplifiers 9 and the input and output voltages of inverting amplifier 9 before short-circuited. Meanwhile, when switch SW1 is turned on, analog voltage Vin is applied from terminal 1 to node 5. Therefore, coupling capacitor 8 is charged by the difference voltage between voltages Vb and Vin.

Subsequently, when control signal $\phi$ is switched to the logical value "0", switches SW1 and SW3 are put in the OFF state while switch SW2 is put in the ON state. When switch SW3 is turned off, impedance at node 6, or input terminal of inverting amplifier 9 increases to infinity. Therefore, the charges stored at node 6 by coupling capacitor 8 for the period when control signal $\phi$ represents the logical value "1" are held until switch SW3 is put in the ON state again. Meanwhile, node 5 receives a predetermined voltage Vaj from terminal Tj instead of analog signal voltage Vin. Since the charges at node 6 are held, a voltage change (Vaj−Vin) appearing at node 5 is transmitted through coupling capacitor 8 to node 6 and inverted and amplified by inverting amplifier 9. Accordingly, when the amplification factor of inverting amplifier 9 is sufficiently large, the potential derived from output terminal 7 is Vdd (when Vin>Vaj) corresponding to the "H" level or ground potential Vss (when Vin<Vaj) corresponding to the "L" level. Thus, in the period where control signal $\phi$ represents the logical value "0", comparison is made between voltage Vin sampled during the period when control signal $\phi$ represents the logical value "1" and reference voltage Vaj output from reference voltage generating circuit RVG so as to output a binary signal corresponding to the comparison result.

As described above, the A/D converter comprising reference voltage generating circuit RVG constituted of two resistor networks compares voltages of (m·n−1) gradations obtained by dividing a difference voltage between reference voltage receiving terminals 2 and 3 with an analog voltage which is to be the digitized. As a result, output pattern of comparing portion CMPG has $2^{m \cdot n - 1}$ types. Encoder ENC outputs different binary data of N bit(s) (N is any natural number) corresponding to the respective $2^{m \cdot n - 1}$ output patterns. Therefore, in order to digitize an analog voltage received at analog voltage receiving terminal 1 with a resolution of N bit(s), values of m and n are selected such that the product (m·n) of the resistor number m in sub-resistor network SR and the resistor number n comprised in each of resistor networks RG1 to Rgm constituting main resistor network MR becomes equal to $2^N$.

Meanwhile, before the reference voltage generating circuit constituted of two resistor networks has been proposed, the reference voltage generating circuits had been constituted of a single resistor network. That is, a reference voltage generating circuit was constituted of only main resistor network MR as shown in FIG. 9. In such a case, if reference voltage receiving terminals 2 and 3 are connected to ideal power sources having an output impedance of 0, output impedance Z(i, k) (i=1, 2, ..., n; k=1, 2, ..., m) of a given tap A(i, k) contained in main resistor network MR is shown as composite impedance of those resistor networks connected between tap A and reference voltage receiving terminal 3 (including series-connected x resistor elements of resistance value r, where x=n·(k−1)+i) and the other resistor networks connected between tap A and reference voltage receiving terminal 2 (including series-connected m·n−x resistor elements of resistance value r. Therefore, the above-mentioned output impedance Z(i, k) is given by the following expression. In the following expression, "||" is the symbol for representing an operation $$"X||Y = \frac{XY}{X+Y}". \tag{1}$$

$$\begin{aligned} Z(i, k) &= r \cdot x || r \cdot (m \cdot n - x) \\ &= \frac{r \cdot x \cdot (m \cdot n - x)}{m \cdot n} \\ &= r \cdot x \cdot \left(1 - \frac{x}{2^N}\right) \end{aligned}$$

FIG. 11 is a diagram showing the output impedance of reference voltage generating circuit RVG. In FIG. 11, the lateral direction represents the locations of taps in reference voltage generating circuit RVG (or location of corresponding output terminals Tj) in main resistor network MR and sub-resistor network SR, and the vertical direction represents the magnitude of impedances. FIG. 11 takes a case as an example that N=2, or the tap number of main resistor network MR is 3. In this case, according to the expression above, the impedances at output terminals T1 to T3 receiving three voltages derived from main resistor network MR, respectively, become larger as the corresponding taps get farther from reference voltage receiving terminals 2 and 3, and reach a maximum value at the center of main resistor network MR, as shown by the curve a. Thus, when reference voltage generating circuit RVG is constituted of main resistor network MR only, both impedances at reference voltage receiving terminals 2 and 3 are 0 if only they are connected to ideal power sources. However, impedances at those output terminals of reference voltage generating circuit RVG that correspond to the taps located in the center of main resistor network MR reach considerable values.

When the output terminals of reference voltage generating circuit RVG provide great impedances, the following problem will arise.

Turning back to comparator CMP in FIG. 10, in response to a switch of control signal φ in logical value from "1" to "0", the analogue voltage at node 5 which has been applied through analog voltage receiving terminal 1 changes to a voltage applied through terminal Tj from reference voltage generating circuit RVG. This causes coupling capacitor 8 to be discharged or charged at a speed inversely proportional to magnitude of the time constant obtained as product of the capacitance value of coupling capacitor 8 and the impedance of terminal Tj. When this discharging or charging has been completed, potential at node 5 settles at a level received at terminal Tj from reference voltage generating circuit RVG. Thus, since charges flow into or out of node 5 when the logical value of control signal φ is switched to "0", potential at terminal Tj fluctuates transitionally. Therefore, when the impedance at terminal Tj is great, it takes a long time for the reference voltage derived from terminal Tj to return to the initial value. This means that it takes a long time also for output of comparator CMP to settle at a correct logical value. In order to obtain correct data from encoder ENC, therefore, it is necessary to make the time sufficiently long in which control signal φ is held at the logical value "0" such that output of comparator CMP settles at the correct logical value. Accordingly, when the impedance of terminal Tj is large, the operation speed of the A/D converter is reduced.

In order to solve the problem above, it may be proposed to make the impedance at terminal Tj small. That is, main resistor network MR comprised in reference voltage generating circuit may be constituted of resistors having a small resistance value.

Now, the resistor elements in a monolithic IC are generally formed of an impurity-diffused layer, a polysilicon layer and the like to be of a rectangular configuration. If the resistance layer has the same depth, the resistance value of a resistor element is determined by the ratio between lengths of two sides of the rectangle. In order to form a resistor element with a small resistance value, the resistor layer is formed to have a long side vertical to a path of current and a short side parallel to the current path. That is, the resistor element with a small resistance value in a monolithic IC is laid out to have one long side and the other short side.

Meanwhile, practical patterns of the resistor elements formed on a monolithic IC deviate from an originally designed layout pattern approximately to the same degree irrespective of dimension of the designed layout pattern. Therefore, in order to restrict the ratio of the deviation to the designed layout pattern (relative error) as much as possible, in consideration of a dispersion of resistance values caused in manufacturing the resistor elements, the designed layout pattern must be made large. On the other hand, the layout pattern for a resistor element with a small resistance value must be a rectangle having one side substantially shorter than another side. As the shorter side has a smaller length, the relative error is increased. Therefore, in forming resistor elements with a small resistance value on a monolithic IC, a large layout pattern is required for the resistor elements. This means a reduction in the integration of the IC.

For the reason described above, when an A/D converter with a reference voltage generating circuit constituted of $2^N$ resistor elements each having a low resistance value is incorporated in a one-chip LSI for example, each of the $2^N$ resistor elements has to be formed to have a large layout pattern. If the resolution of this A/D converter is 8 bits for example, the reference voltage generating circuit RVG requires $2^8$ (=256) resistor elements, and if the resolution is 10 bits, the same requires $2^{10}$ (=1024) resistor elements. Thus, as a higher resolution is required of the A/D converter, a further reduction will be expected in the integration of LSI. Accordingly, it is difficult to reduce substantially resistance values of the resistor elements comprised in the reference voltage generating circuit.

Therefore, it has been proposed that reference voltage generating circuit RVG is constituted of main resistor network MR and sub-resistor network SR, as shown in FIG. 9. In order to obtain output of N bit(s) from an A/D converter, the reference voltage generating circuit shown in FIG. 9 is constituted of main resistor network MR with the number of constituent elements being $2^N$ and of sub-resistor network SR with the number of constituent elements being $2^N/n$, which is much smaller than that of main resistor network MR. Therefore, when this reference voltage generating circuit RVG is formed on a monolithic IC, it becomes possible to form each resistor of sub-resistor network SR each in a large layout pattern. Accordingly, sub-resistor network SR constituted of resistor elements with sufficiently low resistance values can be formed on the LSI, without degrading accuracy of the elements.

Meanwhile, like main resistor network MR, sub-resistor network SR is also constituted of a series connection of a plurality of resistor elements having the same resistance value. Therefore, considering sub-resistor network SR only, output impedances of the taps contained therein become larger, as the corresponding tap gets apart farther from reference voltage receiving terminals 2 and 3, and reach a maximum value at the center of sub-resistor network SR. However, sub-resistor network SR can be constituted of resistor elements of a small resistance value. Therefore, the output impedance of sub-resistor network SR becomes small as a whole in comparison with that (curve a) of main resistor network MR not accompanied by any sub-resistor network SR, as indicated by the curve b in FIG. 11.

Each of the impedances at nodes A (1, n) to A (m−1, n) between sub-resistor network SR and main resistor network MR is considered as composite impedance of two resistor networks connected in the directions of sub-resistor network SR and main resistor network MR, respectively. That is, when impedances of the two resistor networks connected in the direction of sub-resistor network SR and main resistor network MR are represented as $Z_s$ and $Z_m$, respectively, impedance Z at any node is shown by the following expression.

$$Z = Z_S \| Z_M \qquad (2)$$
$$= \frac{Z_S}{1 + (Z_S/Z_M)}$$

Therefore, if composite impedance $Z_s$ of the resistor networks connected in the direction of sub-resistor network SR is substantially small relative to composite impedance $Z_M$ of the resistor networks connected in the direction of main resistor network MR ($Z_S/Z_M \approx 0$), impedances at the respective nodes between main resistor network MR and sub-resistor network SR are equal to those at the corresponding taps in sub-resistor network SR. Further, impedances of those taps in main resistor network MR that are not connected to sub-resistor network SR represent a maximum value at the center of a resistor network (any of RG1 to RGm) containing the tap. Therefore, the output impedance of the reference voltage generating circuit shown in FIG. 9 shows a curve based on the curve b, or curve c in FIG. 11. Accordingly, the output impedance of reference voltage generating circuit RVG is reduced as compared with the case the reference voltage generating circuit is constituted of main resistor network MR only (curve a).

As described above, when reference voltage generating circuit RVG is constituted of two resistor networks, the output impedance of reference voltage generating circuit RVG can be made small within a range applicable also to a monolithic IC.

Meanwhile, the resistance value r of the resistor elements constituting main resistor network MR and the resistance value R of the resistor elements constituting sub-resistor network SR are selected such that potentials obtained at the nodes between resistor networks RG1 to Rgm by dividing a voltage between reference voltage receiving terminals 2 and 3 only in main resistor network MR become equal to those potentials obtained at the nodes between resistors R1 to Rm by dividing the voltage between reference voltage receiving terminals 2 and 3 only in sub-resistor network SR. Thus, no current flow is caused between main resistor network MR and sub-resistor network SR.

FIG. 12 is a schematic block diagram showing structure of a D/A converter.

Referring to FIG. 12, the D/A converter comprises digital signal input terminal 11 for receiving a digital signal to be converted into an analog voltage, analog voltage generating circuit 14 provided between reference voltage receiving terminals 12 and 13 to receive reference voltages of different magnitudes, decoder 15, voltage selecting portion 16, output buffer 17 and analog voltage output terminal 18. Analog voltage generating circuit 14 and reference voltage receiving terminals 12 and 13 correspond to reference voltage generating circuit RVG and reference voltage receiving terminals 2 and 3 in the D/A converter shown in FIG. 8, respectively.

Subsequently, operation of the A/D converter will be described. When a digital signal of N bit(s) is applied to digital signal input terminal 11, decoder 15 converts the digital signal of N bit(s) into a digital signal of $2^N$ bits and outputs the converted signal. Meanwhile, analog voltage generating circuit 14 divides the difference voltage between the reference voltages applied to reference voltage receiving terminals 12 and 13 to apply $2^N$ voltages of different magnitudes to voltage selecting portion 16. Voltage selecting portion 16 comprises $2^N$ switches S1 to S ($2^N$). Each of switches S1 to S($2^N$) is provided between one of the $2^N$ outputs of analog voltage generating circuit 14 and an input terminal of output buffer 17. That is, as shown in the diagram, the $2^N$ outputs of analog voltage generating circuit 14 correspond to switches S1 to S ($2^N$) on a one-to-one basis. These switches S1 to S ($2^N$) are turned on/off in response to output of decoder 15.

More specifically, switches S1 to S ($2^N$) are turned on when either one of the binary voltages at the "L" and "H" levels, which correspond to the logical values "0" and "1", respectively, is received as a control voltage, and turned off when the other one is received as the control voltage. According to output of decoder 15, only one of the switches S1 to S ($2^N$) is selectively turned on and all the other switches are turned off.

When decoder 15 converts the digital signal of N bit(s) into a digital signal which can turn on only one switch (any one of S1 to S($2^N$)) provided for analog voltages within the range indicated by the digital signal, the $2^N$ outputs of decoder 15 are directly applied to switches SW1 to S($2^N$) as control voltages in a one-to-one correspondence. When decoder 15 does not make such conversion, the outputs of decoder 15 are further decoded by logical gates and the like in voltage selecting portion 16 to be converted into a digital signal which can turn on only one appropriate switch among switches S1 to S($2^N$). In this manner, voltage selecting portion 16 selectively applies one of the $2^N$ analog voltages output from analog voltage generating circuit 14 to output buffer 17.

Output buffer 17 is a voltage follower-type operational amplifier having its non-inversion input terminal connected to its output terminal. Therefore, output buffer 17 buffers the analog voltage applied from voltage selecting portion 16 and then applies the same to analog voltage output terminal 18.

In this manner, an analog voltage indicated by the digital signal of N bit(s) is derived from analog voltage output terminal 18.

Meanwhile, when the digital signal applied to input terminal 11 is switched from one indicating an analog voltage within a certain range to another indicating an analog voltage within a different range, a switch that has not been in the on-state is turned on in voltage selecting portion 16. As a result, potential at the input terminal of output buffer 17 changes from one having been so far applied to another applied through the newly turned-on switch. At this time, a connection line between the input terminal of output buffer 17 and voltage selecting portion 16 is charged or discharged. A potential change at the input terminal of output buffer 17 caused by this charging or discharging is derived from output terminal 18 through output buffer 17. After the charging or discharging has been completed later, potential at the input terminal of output buffer 17 settles at the output potential of analog voltage generating circuit 14 that corresponds to the newly turned on switch. Following the above, potential at the output terminal of output buffer 17 also settles at an analog voltage corresponding to the input data signal of the present time. Accordingly, in order to convert a digital signal applied to input terminal 11 into a corresponding analog voltage as soon as possible and output the converted voltage to output terminal 18, potential at the input terminal of output buffer 17 should change desirably in a shortest possible time in response to a switch of the digital signal. That is, it is desirable for the input terminal of output buffer 17 to be charged or discharged in a shortest possible time. For that purpose, impedance at the input terminal of output buffer 17, or output impedance of analog voltage generating circuit 14 should be desirably low. Therefore, also in the D/A converter, a low output impedance is desirable for analog voltage generating circuit 14 corresponding to the above-mentioned reference voltage generating circuit. Thus, by employing the circuit shown in FIG. 9 as analog voltage generating circuit 14, operation speed of the D/A can be enhanced.

For the A/D and D/A converters of recent years used in audio equipments that require digital signal processings, those ones having a resolution no less than 10 bits (12 bits or 14 bits) have been put to practical use. However, since the operation frequency demanded of the A/D and D/A converters used in such audio equipments is no more than 1 MHz, the output impedance of a reference voltage generating circuit used therein needs not to be so low. However, for the A/D and D/A converters used in video equipments in which digital signal processings are necessary, a resolution of 8 bits and a very high operation frequency such as 20 Mhz are required, for example. Further, for the A/D and D/A converters used in the video equipments applied to high-definition broadcasting, a resolution of 10 bits and an operation frequency of 20 MHz or 50 MHz, or a resolution of 8 bits and an operation frequency no less than 50 Mhz are required. Thus, especially for those A/D and D/A converters used in video equipments, a substantially high operation speed as well as a high resolution are required. In these years, therefore, there has been need for A/D and D/A converters having a much higher operation speed than conventional ones and a high resolution. Accordingly, it has been required to reduce the output impedance of a reference voltage generating circuit used in those equipments. For this reason, such a reference voltage generating circuit as shown in FIG. 9 has been contrived.

However, such a conventional reference voltage generating circuit as shown in FIG. 9 comprises a sub-resistor network having a low impedance so as to reduce its output impedance. Therefore, impedances at the respective output terminals of the reference voltage generating circuit varies depending on the corresponding taps. That is, the output impedance of sub-resistor network SR which determines level of the output impedance of main resistor network MR becomes higher at a tap closer to the center of sub-resistor network SR. Therefore, impedances at the nodes (nodes between resistor networks RG1 to RGm) between main resistor network MR and sub-resistor network SR become larger at a portion closer to the center of main resistor network MR. Meanwhile, impedances of those taps in the respective resistor networks GR1 to GRm constituting main resistor network MR that are not connected to sub-resistor network SR become larger as the taps are located closer to the center of a corresponding resistor network, and not constant.

In the case of the A/D converter shown in FIG. 8, when the output impedances of reference voltage generating circuit RVG differ from one terminal to another, operable speeds of all comparator CMP do not represent the same value. Therefore, after the switch of control signal $\phi$ from logical value "1" to "0", if N outputs are fetched from comparing portion CMPG before the above-described transitional phenomenon ends in all comparators CMP, the respective accuracy of the logical values vary depending on the corresponding comparators CMP. As a result, the accuracy of output data of encoder ENC varies between bits. In order to avoid such a phenomenon, the operation frequency of the A/D converter must be determined according to the operable speed of the comparator CMP which is connected to one of the output terminals of reference voltage generating circuit RVG that has a maximum impedance. Thus, if output impedance of reference voltage generating circuit RVG differs from one terminal to another, the A/D converter is prevented from acquiring a high output accuracy and an enhanced operation frequency.

Similarly, in the case of D/A converters, if output impedance of analog voltage generating circuit 14 in FIG. 12 differs from one terminal to another, the time taken for potential at the input terminal of output buffer 17 to settle at a level corresponding to an input digital signal differs between digital signals. That is, according to the input digital signals, the operation speed of the D/A converter varies. Therefore, in order to improve the output accuracy of the D/A converter, timings to fetch an analog voltage from output terminal 18 need to be determined according to the time taken for a potential change caused at the output terminal of output buffer 17 when a switch in voltage selecting portion 16 is turned on that corresponds to the output terminal of analog voltage generating circuit 14 having a highest output impedance. Accordingly, if output impedance of analog voltage generating circuit 14 varies from one output terminal to another, the D/A converter is prevented from acquiring a high output accuracy and an enhanced operation frequency.

Further, in the reference voltage generating circuit for generating a plurality of linear voltages, main resistor network MR and sub-resistor network SR are each constituted of a plurality of resistor elements having the same resistance value. Generally, it is desirable for those linear analog circuits that various values indicative of circuit characteristics, such as impedance, do not represent any non-linear inconsistency.

As described above, if output impedance of a circuit used as a reference voltage generating circuit in an A/D converter or as an analog voltage generating circuit in a D/A converter differs from one terminal to another, functionality of the entire circuit including the circuit can not be enhanced.

SUMMARY OF THE INVENTION

An object of the present invention is to provide a reference voltage generating circuit having a low output impedance.

Another object of the present invention is to provide a reference voltage generating circuit in which difference of output impedances between all output terminals are reduced.

Still another object of the present invention is to provide a reference voltage generating circuit superior in its circuit accuracy.

A further object of the present invention is to provide a reference voltage generating circuit which is superior in its circuit accuracy and has an output impedance at least as low as that of a conventional reference voltage generating circuit and approximately the same impedance at all output terminals.

A still further object of the present invention is to provide a reference voltage generating circuit which can enhance performance of an A/D converter.

A further object of the present invention is to provide a reference voltage generating circuit which can enhance performance of a D/A converter.

Another object of the present invention is to provide an A/D converter which has an enhanced operation speed.

Still another object of the present invention is to provide a D/A converter which has an enhanced operation speed.

In order to obtain the objects described above, a reference voltage generating circuit according to the present invention comprises a first reference voltage receiving terminal for receiving a first reference voltage, a second reference voltage receiving terminal for receiving a second reference voltage, a plurality of resistor elements connected in series between the first and second reference voltage receiving terminals and having the same resistance value r, and resistor networks provided corresponding to all the other nodes than the two nodes closest to the first and second reference voltage receiving terminals, respectively, out of the plurality of resistor elements. Each resistor network is constituted of first and second resistor elements connected in series between the first and second reference voltage receiving terminals and having a composite impedance of 2·r. Each of the nodes between the plurality of resistor elements having the resistance value r is connected to the node between the first and second resistor elements constituting a corresponding resistor network.

According to another aspect of the present invention, a reference voltage generating circuit comprises a first reference voltage terminal, a second reference voltage terminal, and a main resistor network and a sub-resistor network provided in parallel between the first and second reference voltage terminals. The main resistor network comprises a first plurality of resistor networks connected in series between the first and second reference voltage receiving terminals. Each of the first plurality of resistor networks is constituted of a series connection of a second plurality of resistor elements. Meanwhile, the sub-resistor network comprises a first plurality of resistor elements connected in series between the first and second reference voltage receiving terminals and having the same resistance value r, and resistor networks provided corresponding to all the other nodes than the two nodes closest to the first and second reference voltage receiving terminals, respectively, between the first plurality of resistor elements. Each resistor network is constituted of first and second resistor elements connected in series between the first and second reference voltage receiving terminals and having a composite impedance of 2·r. Each of all the other nodes than the above-mentioned two nodes between the first plurality of resistor elements is connected to the node between the first and second resistor elements constituting a corresponding resistor network. Further, the nodes between the first plurality of resistor networks constituting the main resistor network are connected to the nodes between the first plurality of resistor elements constituting the sub-resistor network in a one-to-one correspondence.

According to still another aspect of the present invention, a reference voltage generating circuit comprises a first reference voltage receiving terminal for receiving a first reference voltage, a second reference voltage receiving terminal for receiving a second reference voltage different from the first one, a third reference voltage receiving terminal for receiving a reference voltage of any magnitude, and a main resistor network and a sub-resistor network connected in parallel between the first and second reference voltage receiving terminals. The main resistor network comprises a first plurality of resistor networks connected in series between the first and second reference voltage receiving terminals. Each of the first plurality of resistor networks is constituted of a series connection of a second plurality of resistor elements. Meanwhile, the sub-resistor network comprises the first plurality of resistor elements connected in series between the first and second reference voltage receiving terminals and having the same resistance value r, and resistor elements connected between all the other nodes than the two nodes closest to the first and second reference voltage receiving terminals, respectively, between the first plurality of resistor elements and the third reference voltage receiving terminal and having a resistance value of 2·r. The nodes between the first plurality of resistor networks constituting the main resistor network are connected to the nodes between the first plurality of resistor elements constituting the sub-resistor network in a one-to-one correspondence.

According to a preferred embodiment of the present invention, a third reference voltage receiving terminal is provided corresponding to each of the second resistor elements. Each of the third reference voltage receiving terminals receives a voltage different from both first and second reference voltages as a third reference voltage. The voltages applied to the sub-resistor network as the third reference voltages vary between the third reference voltage receiving terminals.

According to another preferred embodiment of the present invention, the sub-resistor network comprises seven first resistor elements connected in series between the first and second reference voltage receiving terminals. Excepting now the two nodes closest to the first and second reference voltage receiving terminals, respectively, out of the nodes between the seven first resistor elements, there are four nodes. Second resistor elements are connected between the two nodes closer to the first reference voltage receiving terminal out of the four nodes and the first reference voltage receiving terminal. Second resistor elements are further connected between the two nodes closer to the second reference voltage receiving terminal out of the four nodes and the second reference voltage receiving terminal. That is, in the present preferred embodiment, the first and second reference voltage receiving terminals are used as the third reference voltage receiving terminals. Therefore, the second resistor elements connected to the two nodes closer to the first reference voltage receiving terminal receive the first reference voltage, while the second resistor elements connected to the other two nodes closer to the second reference voltage receiving terminal receive the second reference voltage. In this case, difference potentials between the nodes between the first resistor elements are not the same but become larger at a node located father from the first and second reference voltage receiving terminals.

According to still another aspect of the present invention, the reference voltage generating circuit comprises a first reference voltage receiving terminal for receiving a first reference voltage, a second reference voltage receiving terminal for receiving a second reference voltage different from the first one, a third reference voltage receiving terminal for receiving a third reference voltage equal to an intermediate value between the first and second reference voltages, a main resistor network provided between the first and second reference voltage receiving terminals, and first and second sub-resistor networks connected in series between the first and second reference voltage receiving terminals.

The first sub-resistor network comprises a plurality of first resistor elements connected in series between the first and third reference voltage receiving terminals and having the same resistance value, and second resistor elements connected between all the other nodes than the two nodes closest to the first and third reference voltage receiving terminals, respectively, between the plurality of first resistor elements and the third reference voltage receiving terminal. The second sub-resistor network comprises a plurality of third resistor elements connected in series between the second and third reference voltage receiving terminals and having the same resistance value as that of the first resistor elements, and fourth resistor elements connected between all the other nodes than the two nodes closest to the second and third reference voltage receiving terminals, respectively, between the plurality of third resistor elements and the third reference voltage receiving terminal. The main resistor network comprises resistor networks connected in series between the first and second reference voltage receiving terminals, the number of which is equal to the sum of the number of the first resistor elements and the number of the second resistor elements. The nodes between the resistor networks in the main resistor network are connected to the nodes between the first resistor elements in the first sub-resistor network, the nodes between the third resistor elements in the second-sub-resistor network, and the node between the first and second sub-resistor networks in a one-to-one correspondence. Each second resistor element has a resistance value twice that of each first resistor element, and each fourth resistor element has a resistance value twice that of each third resistor element. In this case, difference potentials between the nodes between the first and second reference voltage receiving terminals (nodes between the second resistor elements and nodes between the fourth resistor elements) become smaller at nodes located farther from the first and second reference voltage receiving terminals.

As described above, the reference voltage generating circuit according to the present invention comprises a circuit portion constituted of a plurality of resistor elements connected in series between the first and second reference voltage receiving terminals for receiving reference voltages of different magnitudes and having the same resistance value r, and of resistor networks each having a composite impedance of 2·r or of resistor elements each having a resistance value of 2·r which are connected to all the other nodes than the two nodes closest to the first and second reference voltage receiving terminals, respectively, out of the nodes between the plurality of resistor elements. In this circuit portion, impedance at the node closest to the first reference voltage receiving terminal out of the nodes between the plurality of resistor elements is r and 2·r in the directions of the first and second reference voltage receiving terminals, respectively. Similarly, impedance at the node closest to the second reference voltage receiving terminal is 2·r and r in the directions of the first and second reference voltage receiving terminals, respectively. Further, among all the nodes mentioned above, impedance at all the other nodes than the two nodes is 2·r in all the directions of the first and second reference voltage receiving terminals and of a corresponding resistor network (or a resistor element). Therefore, output impedances at all these nodes represent the same value (2·r/3).

According to the present invention, the circuit portion itself is used as a reference voltage generating circuit or as a sub-resistor network. In the case that the circuit portion itself is used as a reference voltage generating circuit, impedances at all the output terminals of the reference voltage generating circuit are the same.

In the case that the circuit portion is used as a sub-resistor network, voltages developed at the respective above-mentioned nodes are applied to corresponding taps in the main resistor network. Therefore, when the output impedance of the sub-resistor network is substantially small as compared with that of the main resistor network alone, the composite impedance at a corresponding tap obtained from the directions of the sub-resistor network and the main resistor network becomes approximately equal to the output impedance at the nodes between the plurality of resistor elements constituting the sub-resistor network, or 2·r/3. Accordingly, the output impedance of the main resistor network having the sub-resistor network connected thereto represents the same value at all the taps connected to the sub-resistor network. As a result, the output impedance of those taps among the taps of the main resistor network that are not connected to the sub-resistor network does not so much depend on the locations of taps in the main resistor networks as in the conventional cases. Therefore, also in this case, differences of impedances between the output terminals of the reference voltage generating circuit become small as compared with the conventional cases.

An A/D converter according to the present invention comprises a reference voltage generating circuit as described above, as an analog voltage generating circuit for generating a plurality of different analog voltages. The A/D converter according to the present invention further comprises comparing circuits provided corresponding to the plurality of different analog voltages to compare the plurality of different analog voltages generated by the analog voltage generating circuit with an externally applied analog voltage that is to be converted into a digital signal, and digital signal producing circuits for producing, based on the comparison result of the comparing circuits, a digital signal corresponding to the externally applied analog voltage in a predetermined form.

According to a preferred embodiment of the present invention, the comparing circuit comprises a first input terminal for receiving a corresponding analog voltage, a second input terminal for receiving the externally applied analog voltage, an output terminal, a capacitor, a first switching circuit provided between the first input terminal and one terminal of the capacitor, a second switching circuit provided between the second input terminal and the one terminal of the capacitor, a third switching circuit and an invertor connected in parallel between the other terminal of the capacitor and the output terminal. The first and third switching circuits and the second switching circuit are complementarily turned on/off.

The D/A converter according to the present invention comprises a reference voltage generating circuit as described above as an analog voltage output circuit for outputting a plurality of different analog voltages and further comprises a decoder for decoding a digital signal which is to be converted into an analog voltage, and a circuit for selecting, in response to the decoded output of the decoder, one analog voltage out of the plurality of different analog voltages generated by the analog voltage output circuit which corresponds to the digital signal and outputting the selected one.

As described above, in the reference voltage generating circuit according to the present invention, impedances at the respective output taps of the sub-resistor network represent the same and relatively low value. Therefore, the reference voltages generating circuit is constituted of the sub-resistor network only or of the sub-resistor network and a main resistor network constituted of a series connection of a plurality of resistors, with the output taps of the former being connected to those of the latter. Accordingly, dependency of the output impedance of the reference voltage generating circuit on the locations of output taps is reduced as compared with the conventional cases. As a result, the operation speed and accuracy of the A/D and D/A converters as described above, to which the reference voltage generating circuit of the present invention is applied, are enhanced as compared with those in the conventional cases.

The foregoing and other objects, features, aspects and advantages of the present invention will become more apparent from the following detailed description of the present invention when taken in conjunction with the accompanying drawings

DESCRIPTION OF THE PREFERRED EMBODIMENTS

Figure 1:
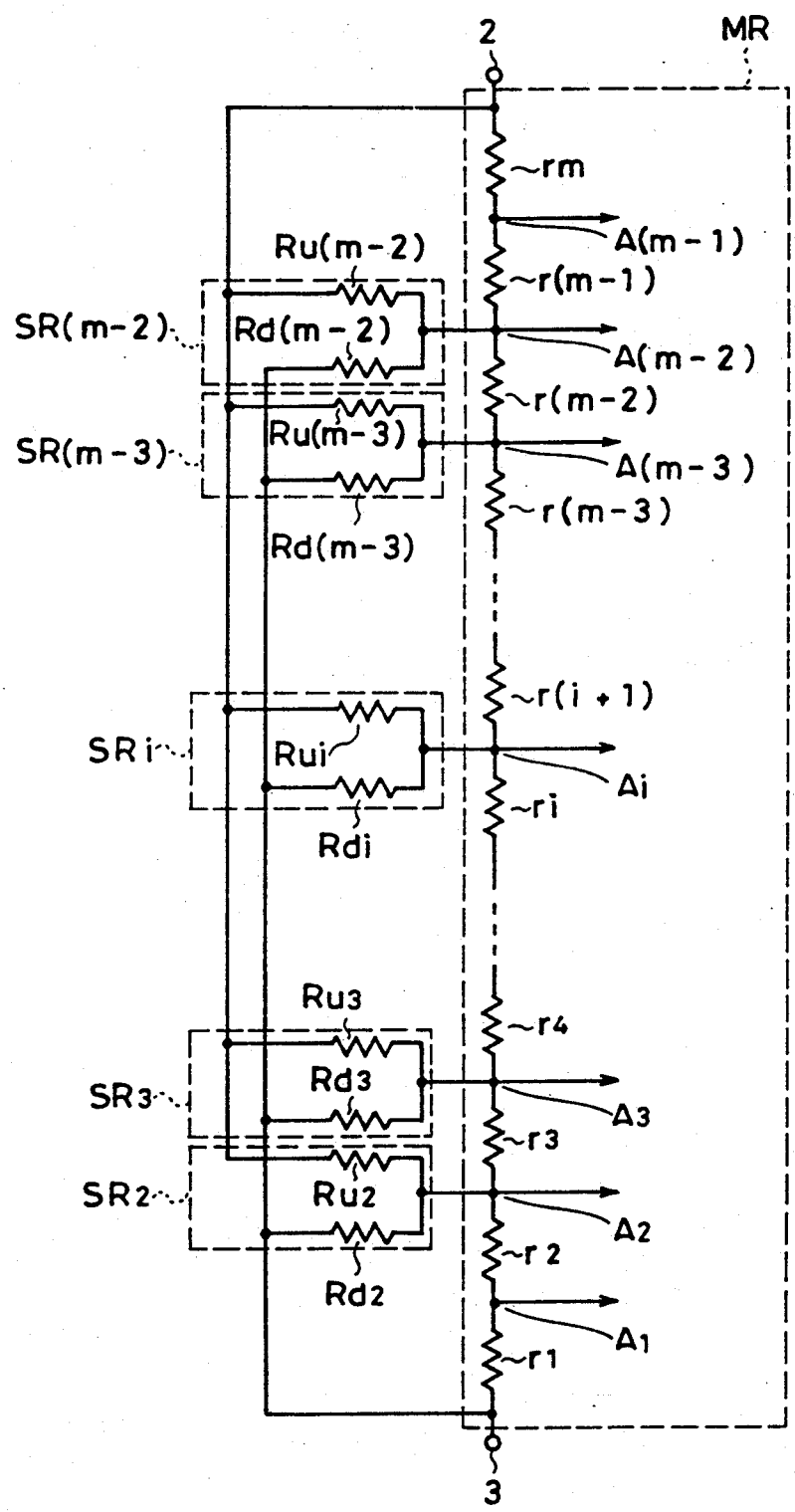
FIG. 1 is a circuit diagram showing a reference voltage generating circuit according to an embodiment of the present invention.

FIG. 1 is a circuit diagram showing a reference voltage generating circuit according to an embodiment of the present invention. The reference voltage generating circuit generates linear reference voltages of $m-1$ ($m=2, 3, \ldots$) gradations.

Referring to FIG. 1, the reference voltage generating circuit comprises, like a conventional one, main resistor network MR and ($m-3$) sub-resistor networks SR2 to SR($m-2$) provided between reference voltage receiving terminal 2 for receiving a predetermined reference voltage and reference voltage receiving terminal 3 for receiving a predetermined reference voltage lower than the voltage applied to reference voltage receiving terminal 2.

Main resistor network MR is constituted of, like a conventional one, a series connection of m resistors r1 to rm provided between reference voltage receiving terminals 2 and 3 and having the same resistance value r.

Each of sub-resistor networks SR2 to SR($m-2$) is constituted of a series connection of two resistors Ru and Rd provided between reference voltage receiving terminals 2 and 3.

Sub-resistor networks SR2 to SR($m-2$) are provided each corresponding to one of all the other nodes than the two nodes A($m-1$) and A1 that are closest to reference voltage receiving terminals 2 and 3, respectively, out of the nodes A1 to A($m-1$) between resistors r1 to rm constituting main resistor network MR. A tap Ai ($i=2$ to $m-2$) in main resistor network MR is connected to the node between the two resistors Rui and Rdi constituting a corresponding sub-resistor network SRi.

The resistance values of the respective two resistors Rui and Rdi constituting any sub-resistor network SRi are set such that the corresponding tap Ai in main resistor network MR has an impedance Zsi of $2 \cdot r$ in the direction of the corresponding sub-resistor network. When the resistance values of the respective two resistors Rui and Rdi constituting any sub-resistor network SRi are shown as rui and rdi, respectively, the above-mentioned impedance Zsi is equal to the composite impedance of the two resistors Rui and Rdi, or rui || rdi. Therefore, the resistance values rui and rdi are selected to satisfy the following expression.

$$1/(1/rui + 1/rdi) = 2 \cdot r \quad (3)$$

Thus, according to the present embodiment, all the other taps than the two taps at both ends of main resistor network MR are each connected to a sub-resistor network having the composite impedance of $2 \cdot r$. Therefore, all the ($m-3$) taps of the main resistor network have impedances of the same value ($2 \cdot r/3$) in the directions of the sub-resistor networks.

Figure 2:
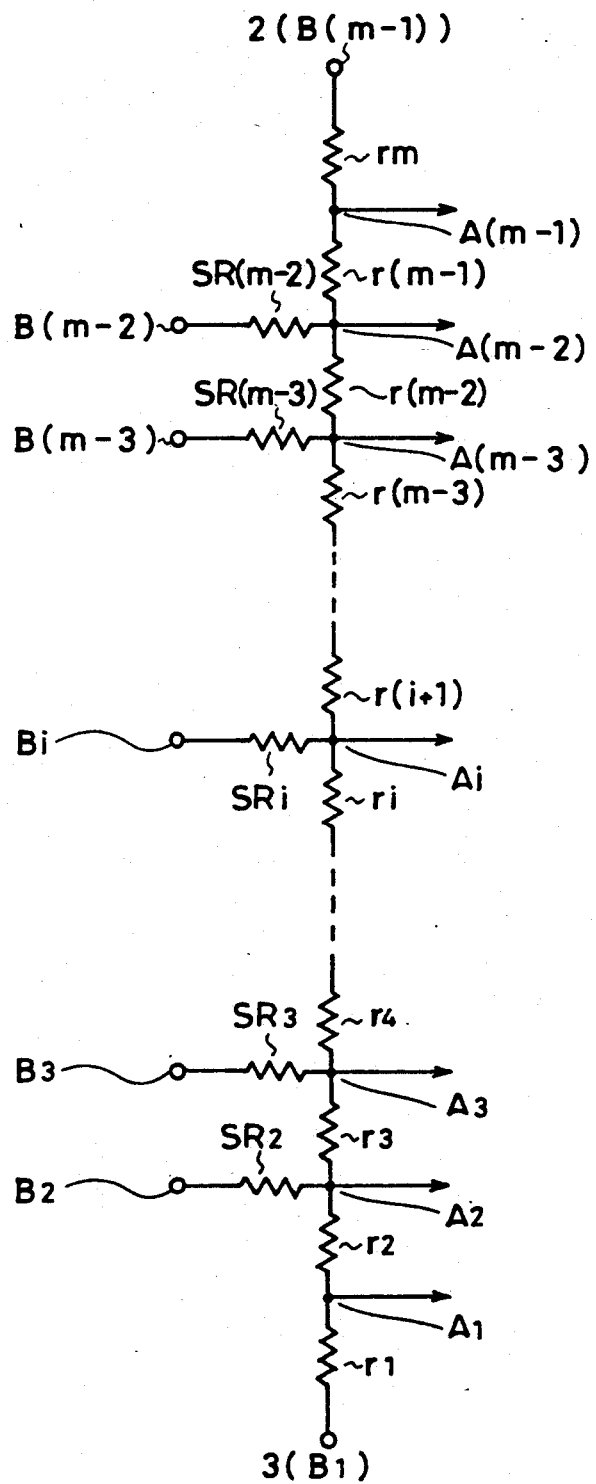
FIG. 2 is a circuit diagram showing ah equivalent circuit of the reference voltage generating circuit shown in FIG. 1.

FIG. 2 is a circuit diagram of the reference voltage generating circuit shown in FIG. 1 where sub-resistor networks SR2 to SR($m-2$) are equivalently shown as composite resistors connected to voltage sources B2 to B($m-2$) and each having an impedance of $2 \cdot r$. In the following, it will be shown with reference to FIG. 2 that all the taps of main resistor network MR have impedances of the same value.

First, since tap A1 closest to a lowest potential source B1 (corresponding to reference voltage receiving terminal 3 in FIG. 1) has an impedance of r in the direction of the low potential source B1, the following tap A2 has a composite impedance of two resistors having the same resistance value r in the direction of the low potential source, or $2 \cdot r$. Therefore, the composite impedance obtained at tap A2 from impedances in the directions of the sub-resistor network and the low potential source is shown as $2 \cdot r \,||\, 2 \cdot r \,(= 1/(\frac{1}{2} \cdot r + \frac{1}{2} \cdot r))$, or equal to r. This means that the sub-resistor network connected to tap A2 and the resistor network provided between tap A2 and the low potential source are each equivalent to a single resistor element having an impedance of r. Further, the impedance obtained at a tap A3 from impedances in the direction of the low potential source is represented as a composite impedance of resistor r3 provided between taps A3 and A2 and of the resistor networks connected to tap A2 in the directions of the sub-resistor network and the low potential source.

Now, since the composite impedance obtained at tap A2 from impedances in the directions of the sub-resistor network and the low potential source is r, the impedance at tap A3 in the direction of the low potential source is represented as 2·r. Therefore, the composite impedance obtained at tap A3 from impedances in the directions of the sub-resistor network and the low potential source is 2·r || 2·r, or r as in the case of tap A2. Also for other taps A4, A5, . . . , all the impedances in the direction of the low potential source are 2·r.

Meanwhile, also for taps A(m−1), A(m−2), . . . closer to a high potential source (corresponding to reference voltage receiving terminal 2), the impedances in the direction of the high potential source are found in the same manner as described above. That is, only tap A(m−1) closest to the high potential source has an impedance of r in the direction of the high potential source, while all the other taps A(m−2), A(m−3), . . . , have impedances of 2·r in the direction of the high potential source. Accordingly, any tap Ai connected to a resistor network in all the directions of the low potential source, the high potential source and the sub-resistor network has an impedance of 2·r in both directions of the low potential source and the high potential source. Therefore, each impedance Z of all the taps A2 to A(m−2) having three branches is shown by the following expression.

$$Z = 2 \cdot r \;||\; 2 \cdot r \;||\; 2 \cdot r = 2 \cdot r/3 \tag{4}$$

Further, tap A1 connected to resistor networks only in the directions of the low potential source and the high potential source has impedances of r and 2·r in the directions of the low potential source or the high potential source. Likewise, tap A(m−1) has impedances of 2·r and r in the respective directions of the low potential source and the high potential source. In this manner, both taps A1 and A(m−1) having two branches have an impedance of r in one direction and an impedance of 2·r in the other direction. Therefore, each impedance Z of these taps A1 and A(m−1) are also shown by the following expression.

$$Z = r \;||\; 2 \cdot r = 2 \cdot r/3 \tag{5}$$

Figure 8:
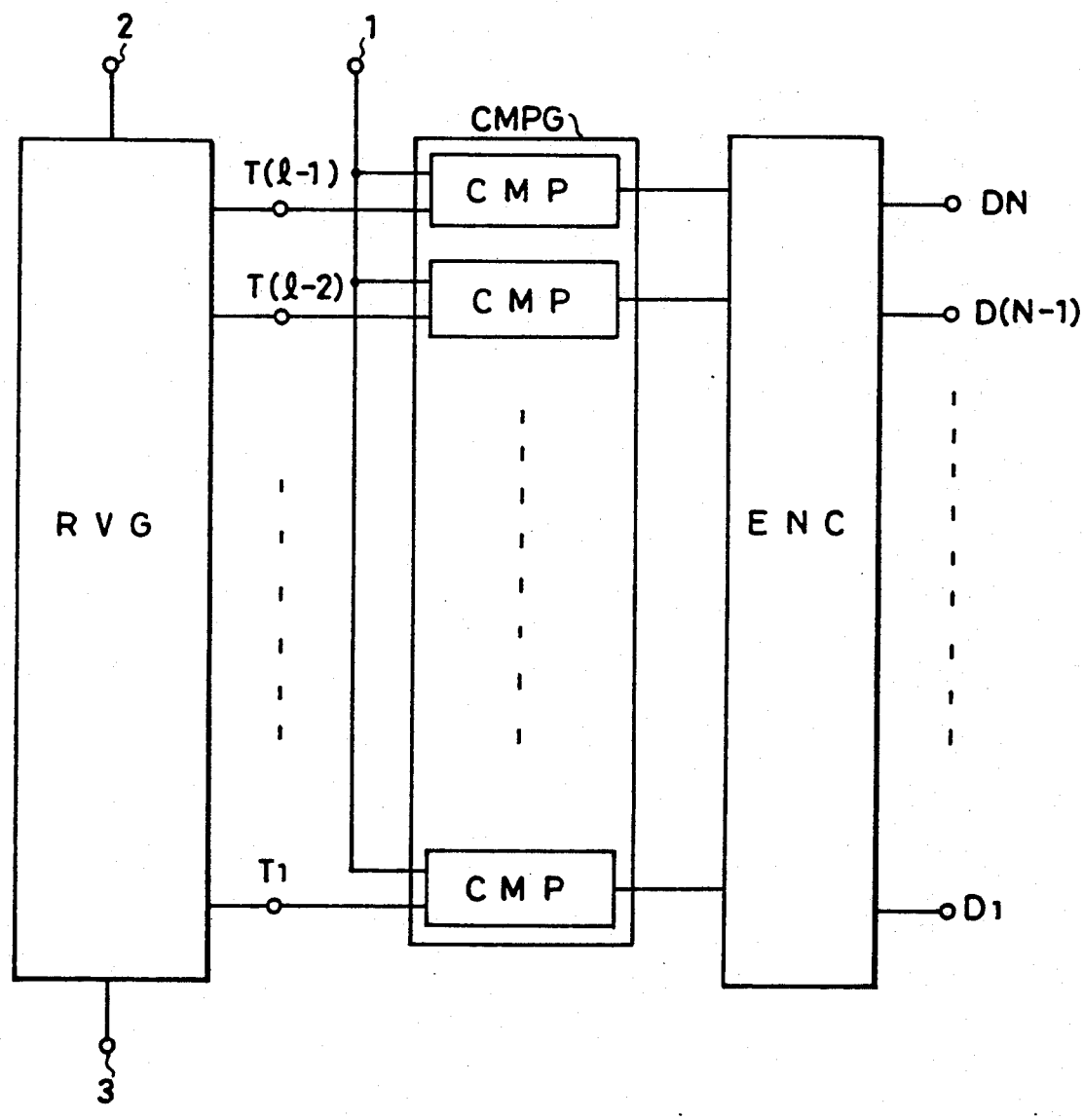
FIG. 8 is a schematic block diagram showing the entire structure of an A/D converter.
Figure 9:
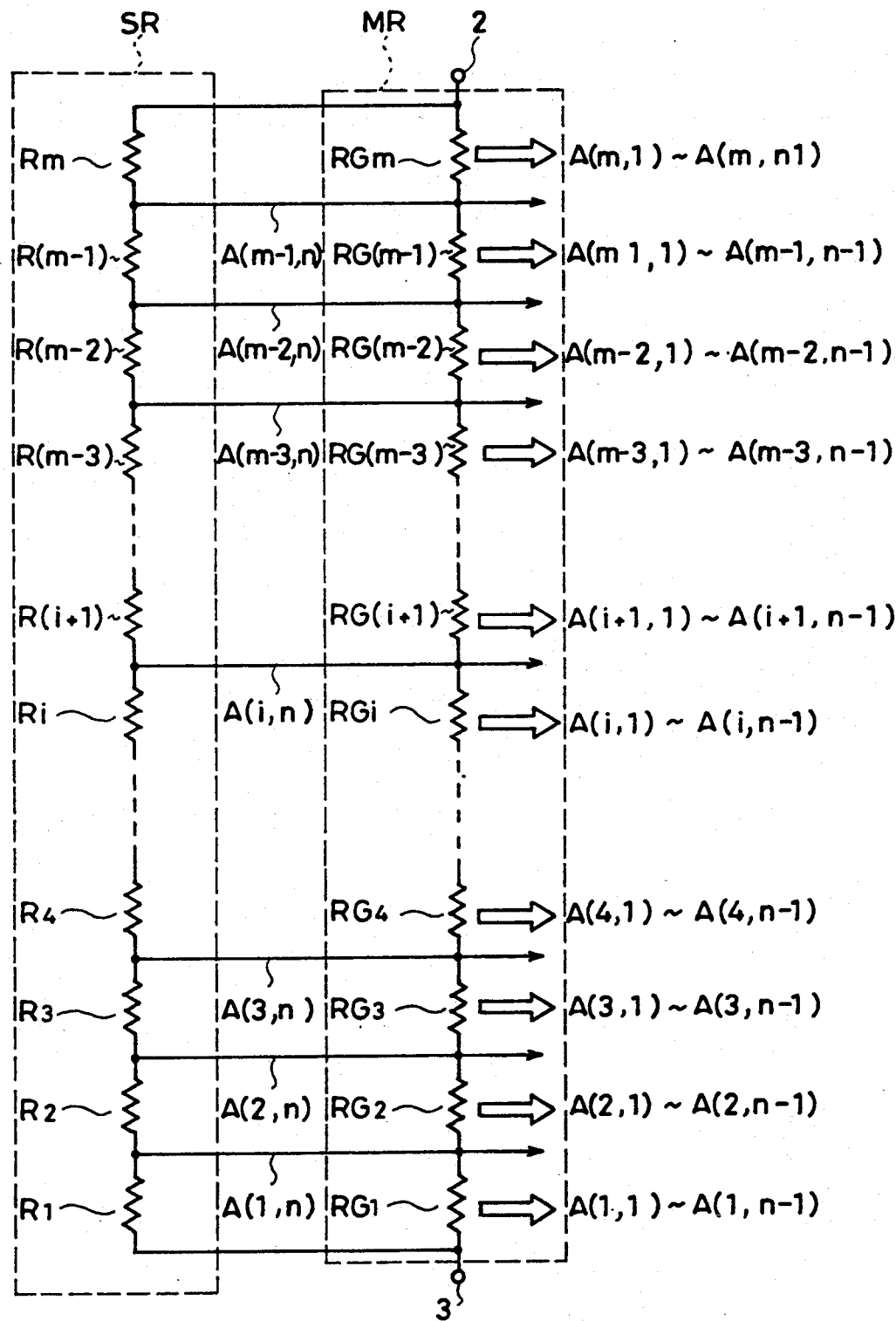
FIG. 9 is a circuit diagram showing structure of a conventional reference voltage generating circuit.
Figure 10:
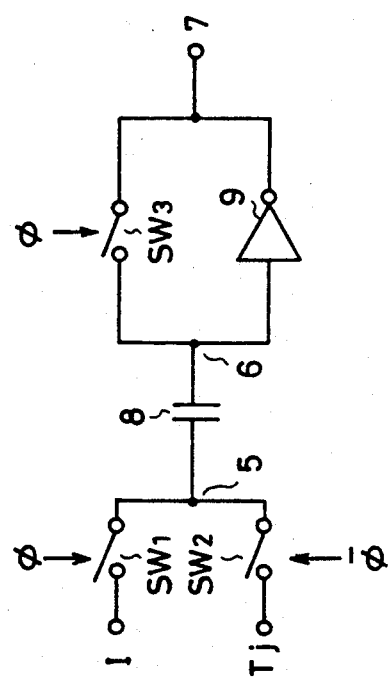
FIG. 10 is a circuit diagram showing a structure of the comparator shown in FIG. 8.

The value of impedance 2·r/3 at taps A1 to A(m−1) in the main resistor network of the present embodiment is as low as that of the conventional reference voltage generating circuit shown in FIG. 9 (see expression (1)). Therefore, according to the present embodiment, the output impedance of the reference voltage generating circuit represents the same value at any tap and is as low as that in the conventional cases. Accordingly, when this reference voltage generating circuit is employed in the A/D converter shown in FIG. 8 for example, all the comparators CMP in the comparing portion CMPG have the same operable speed. As a result, the accuracy of an output signal from encoder ENC is equal for all the bits and at the same time, enhanced. Further, the operation speed of comparing portion CMPG needs not to be made equal to the operable speed of a specific comparator CMP, so that the operation frequency of the A/D converter can be enhanced.

Figure 12:
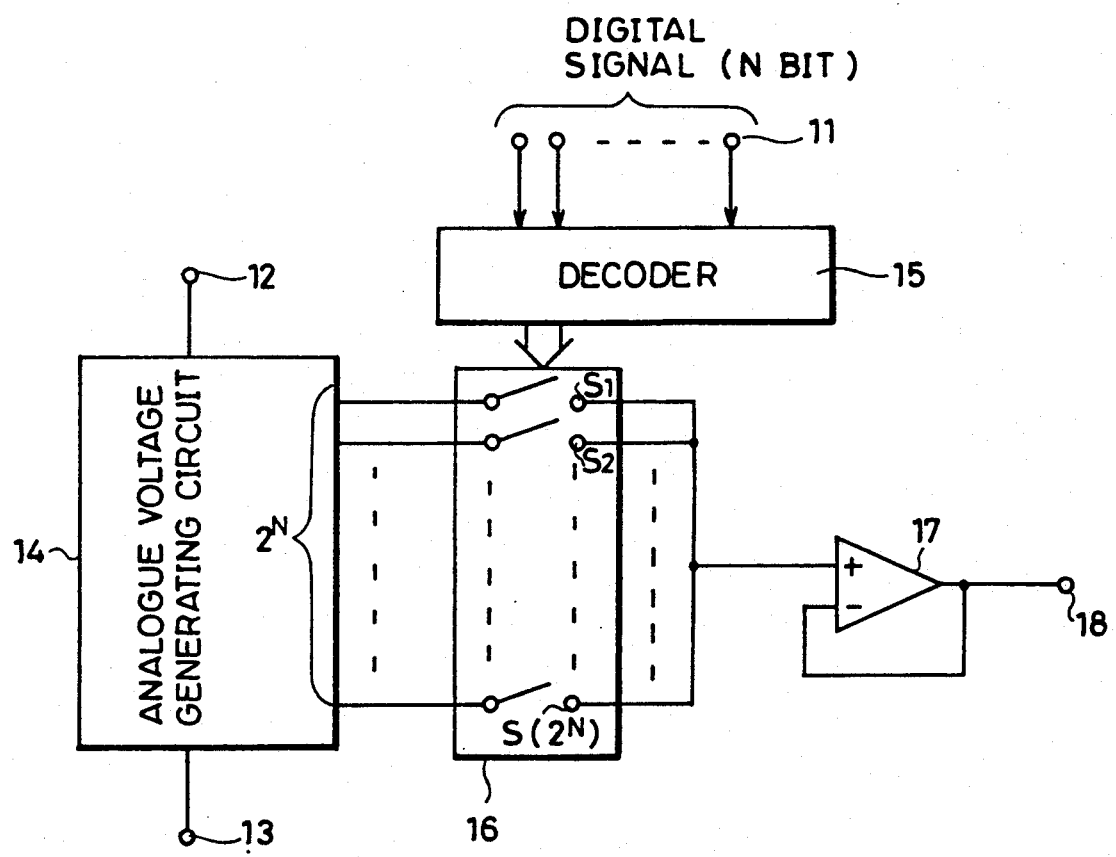
FIG. 12 is a schematic block diagram showing the entire structure of a D/A converter.

Similarly, if the reference voltage generating circuit is employed in the D/A converter shown in FIG. 12, the output accuracy of output buffer 17 does not depend on an input digital signal. Therefore, there is no need to adjust the timing for fetching output of output buffer 17 to a specific digital signal. As a result, the operation speed and accuracy of the D/A converter can be enhanced.

Turning back to FIG. 1, since all resistors r1 to rm constituting main resistor network MR have the same resistance value, a voltage between reference voltage receiving terminals 2 and 3 is equally divided in main resistor network MR. As a result, the relationship between voltages developed at taps A1 to A(m−1) is linear. That is, potential Vai at any tap Ai is given by the following expression, where voltages applied to reference voltage receiving terminals 2 and 3 are shown as V2 and V3, respectively.

$$Vai = i \cdot (V2 - V3)/m \tag{6}$$

Meanwhile, in a given sub-resistor network SRi, the voltage between reference voltage receiving terminals 2 and 3 is divided in the ratio rdi/(rui+rdi) which corresponds to the ratio between the resistance values of order not to cause any current flow between the main resistor network and the sub-resistor network as in the conventional cases, the respective resistance values of resistors Rui and Rdi are set such that potential Vai at any tap Ai connected to a sub-resistor network becomes equal to potential at the node between resistors Rui and Rdi constituting the corresponding sub-resistor network. That is, the resistance values rui and rdi are selected to satisfy the following expression.

$$rdi/(rui + rdi) = i/m \tag{7}$$

Thus, the resistance values rui and rdi of the two resistors constituting the sub-resistor network SRi are set to satisfy both of the above-mentioned expressions (3) and (7). Therefore, more specifically, the resistance values rui and rdi of the two resistors constituting a sub-resistor network SRi connected to a given tap Ai are found by the following expressions.

$$rui = 2 \cdot m \cdot r/i \tag{8}$$

$$rdi = 2 \cdot m \cdot r/(m - i) \tag{9}$$

Figure 4:
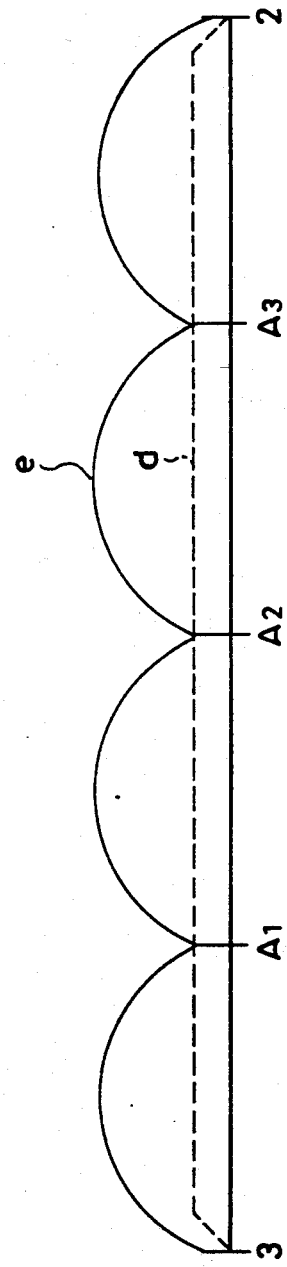
FIG. 4 is a diagram showing a relationship between the output impedance and the locations of output taps in the reference voltage generating circuits shown in FIGS. 1 and 3.

FIG. 4 is a diagram showing a relationship between the output impedance and the locations of taps in main resistor network MR in the reference voltage generating circuit of the present embodiment. In FIG. 4, the lateral direction shows the locations of taps in main resistor network MR (or sub-resistor network) and corresponding potentials, and the vertical direction shows magnitude of impedances. Meanwhile, the right and left ends of the lateral direction correspond to reference voltage receiving terminals 2 and 3, respectively. In FIG. 4, there is shown a case that the reference voltage generating circuit of FIG. 1 generates voltages of three gradations, or m is 4.

Referring to FIG. 4, when both of reference voltage receiving terminals 2 and 3 are connected to ideal power sources, both impedances at reference voltage receiving terminals 2 and 3 are 0. Further, all the output impedances at taps A1 to A(m−1) in main resistor network MR represent the same value (2·r/3) as shown by the curve e. Impedances between these taps become larger at a position farther from the taps and represent a maximum value at the centers between the taps. Meanwhile, the line d shown in the diagram is obtained by linking impedances at the taps of the sub-resistor networks corresponding to the respective taps of main resistor network MR.

As described above, according to the present embodiment, though the output impedance of main resistor network MR does not represent the same value except at the both ends of each of resistors rl to rm constituting main resistor network MR, all impedances at the nodes between resistors rl to rm are set to represent the same value by the sub-resistor networks.

Figure 3:
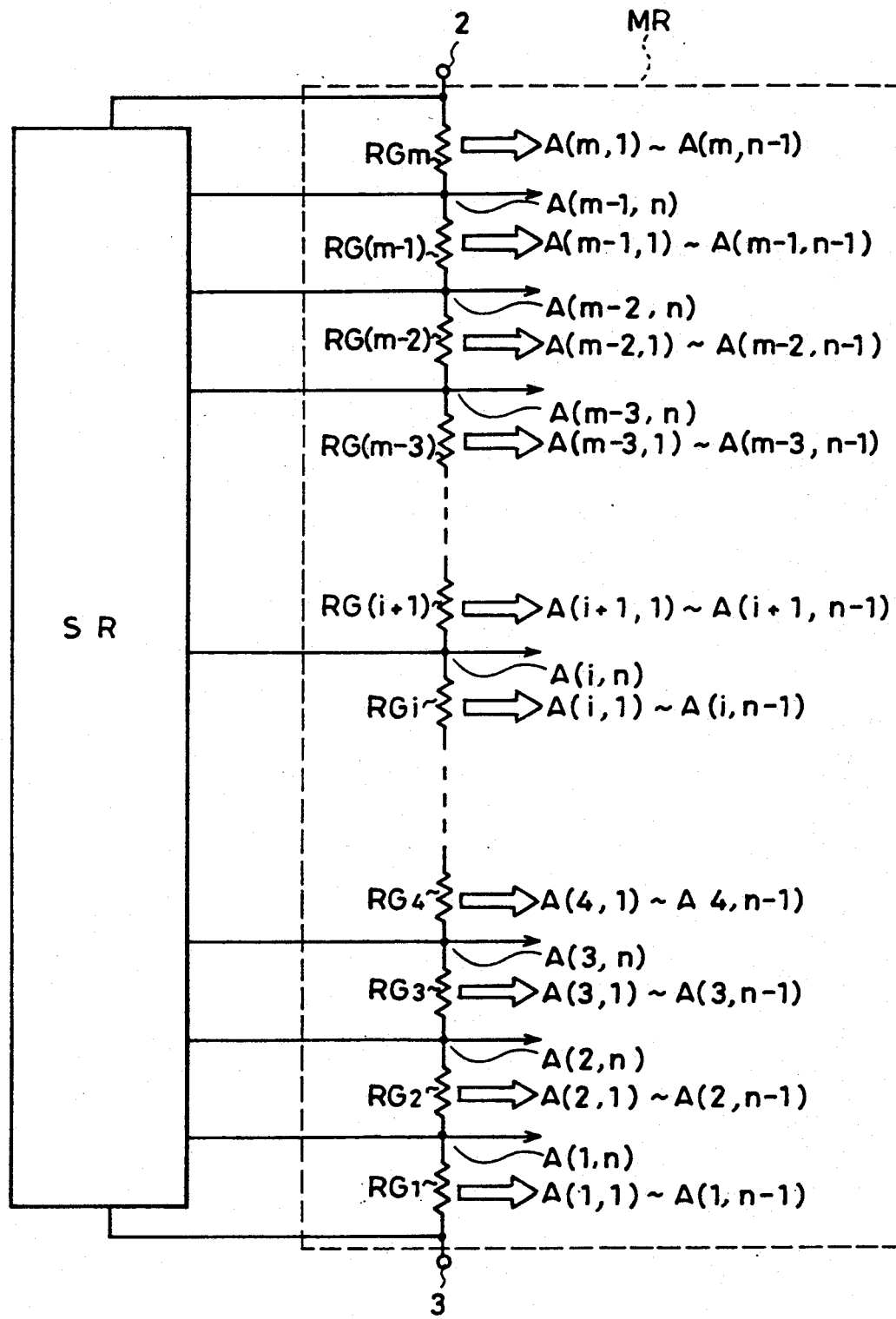
FIG. 3 is a circuit diagram showing a reference voltage generating circuit according to another embodiment of the present invention.

While in the embodiment above, description has been made on the case that the reference voltage generating circuit is constituted of only the resistor network having the composite impedance of $2 \cdot r$ and the resistor network comprising the series connection of resistors each having the resistance value r, the entire circuit shown in FIG. 1 may be used as a sub-resistor network. FIG. 3 is a circuit diagram of a reference voltage generating circuit constituted in such a manner.

Referring to FIG. 3, in this reference voltage generating circuit, the reference voltage generating circuit shown in FIG. 1 or FIG. 2 is used as sub-resistor network SR and a resistor network having the same structure as the main resistor network MR shown in FIG. 9 is used as main resistor network MR.

More specifically, the main resistor network MR shown in FIG. 3 comprises m resistor networks RG1 to RGm connected in series between reference voltage receiving terminals 2 and 3. Each of resistor networks RG1 to RGm is constituted of a series connection of n resistors having the same resistance value r. Voltages developed at nodes A (l, n) to A (m−1, n) between resistor networks RG1 to RGm and at nodes A (1, 1) to A (1, n−1), A (2, 1) to A (2, n−1), ..., A (m, l) to A (m, n−1) between n resistors constituting each of the resistor networks are fetched as output voltages of this reference voltage generating circuit. The nodes A (l, n) to A (m−1, n) between resistor networks RG1 to RGm are connected to the taps A1 to A(m−1) in FIG. 1 in a one-to-one correspondence. Therefore, the voltages derived from the taps A1 to A(m−1) in FIG. 1 are further divided between the n resistors constituting each of resistor networks RG1 to RGm in main resistor network MR in FIG. 3. Since the resistors constituting resistor networks RG1 to RGm have the same resistance value, this reference voltage generating circuit outputs linear voltages obtained by equally dividing a difference voltage between voltages V2 and V3 applied to reference voltage receiving terminals 2 and 3.

Meanwhile, when main resistor network MR and sub-resistor network SR are connected in the manner described above, impedances at those taps A (l, m) to A(m−1, n) among the taps of main resistor network MR that are connected to sub-resistor network SR become approximately equal to impedances at the corresponding taps A1 to A(m−1) in sub-resistor network SR. As previously described, such a relationship stands only when the output impedance of sub-resistor network SR is substantially small as compared with that of main resistor network MR. Therefore, the resistance value r must be set such that the impedance $(2 \cdot r/3)$ at the taps A1 to A(m−1) in FIG. 1 is substantially small relative to the output impedance of a main resistor network MR having no resistor network SR connected thereto (see the expression (1)). By setting the resistance value r in such a manner, the impedances at the taps A(l, n) to A(m−1, n) in main resistor network MR of the present embodiment that are connected to sub-resistor network SR become equal to those at the corresponding taps A1 to A(m−1) in the sub-resistor network, or $2 \cdot r/3$.

In the present embodiment, however, all the taps outputting the reference voltages in main resistor network MR do not provide the same impedance. That is, impedances at those taps A(1, 1) to A(1, n−1), A(2, 1) to A(2, n−1), ..., A(m, l) to A(m, n−1) that are not connected to sub-resistor network SR become larger at a position farther from both ends of a corresponding resistor network (any or RG1 to RGm) and reach a maximum value at the center of the resistor network. However, since all impedances at the nodes between resistor networks RG1 to RGm are the same, the phenomenon that impedances at the taps vary between the resistor networks is avoided. That is, since all impedances at those taps of the main resistor network that are connected to the sub-resistor network are fixed at a certain value, dependency of the output impedance of the main resistor network on the locations of taps is considerably reduced as compared with the conventional cases. Thus, in the present embodiment, not only the output voltages of those taps having the same impedance in FIG. 4 but the output voltages at the other taps located between those taps are used as reference voltages. When the reference voltage generating circuit is configured as described above, the number of output taps in sub-resistor network SR may be 1/n of the number (m·n−1) of output taps in main resistor network MR. Therefore, when compared with a reference voltage generating circuit having the structure shown in FIG. 1, the reference voltage generating circuit shown in FIG. 3 needs a less number of resistor elements employed in the sub-resistor network to obtain the same number of reference voltages. Meanwhile, the sub-resistor network in this case represents the entire circuit constituted of sub-resistor networks SR2 to SR(m−2) and m resistors rl to rm shown in FIG. 1. Thus, when the sub-resistor network is constituted of a less number of resistor elements, it becomes possible to form the resistor elements constituting the sub-resistor network with a large layout pattern in forming this reference voltage generating circuit on a one-chip LSI, for example. As a result, the dispersion of resistance values brought about in manufacturing the resistor elements constituting the sub-resistor network is reduced and the reference voltage generating circuit is enhanced in its accuracy.

While in any of the above-described embodiments, the circuit shown in FIG. 1 is provided between two reference voltage receiving terminals, the same may be provided between more than three reference voltage receiving terminals that receive different voltages. In such a case, however, magnitudes of the reference voltages applied to the respective reference voltage receiving terminals must be set to such values that voltages developed at the output taps of sub-resistor networks SR to SR(m−2) become equal to voltages developed at the corresponding taps in main resistor network MR.

Figure 5A:
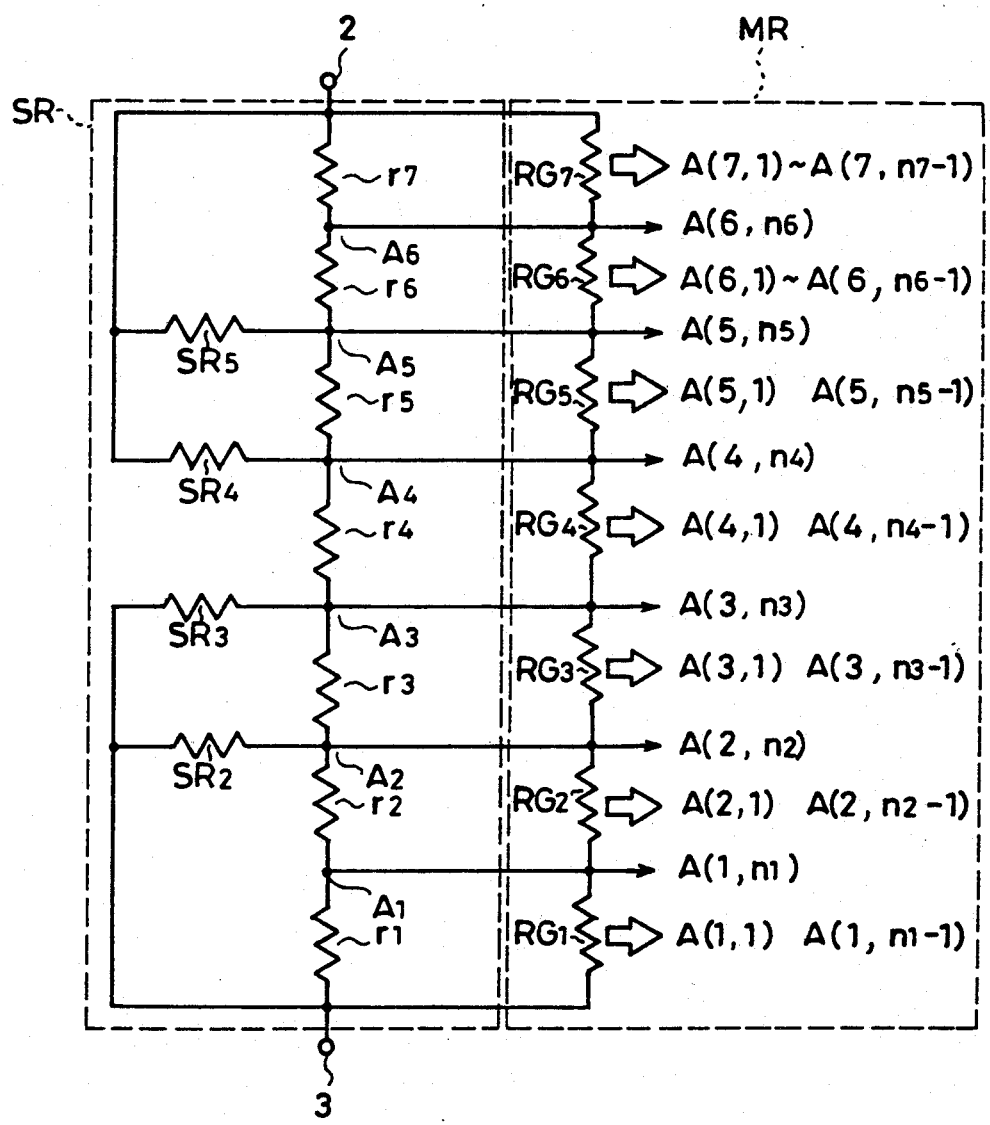
FIGS. 5(a) and 5(b) and 5(c) are partial circuit diagrams showing reference voltage generating circuits according to still another embodiments of the present invention.
Figure 5B:
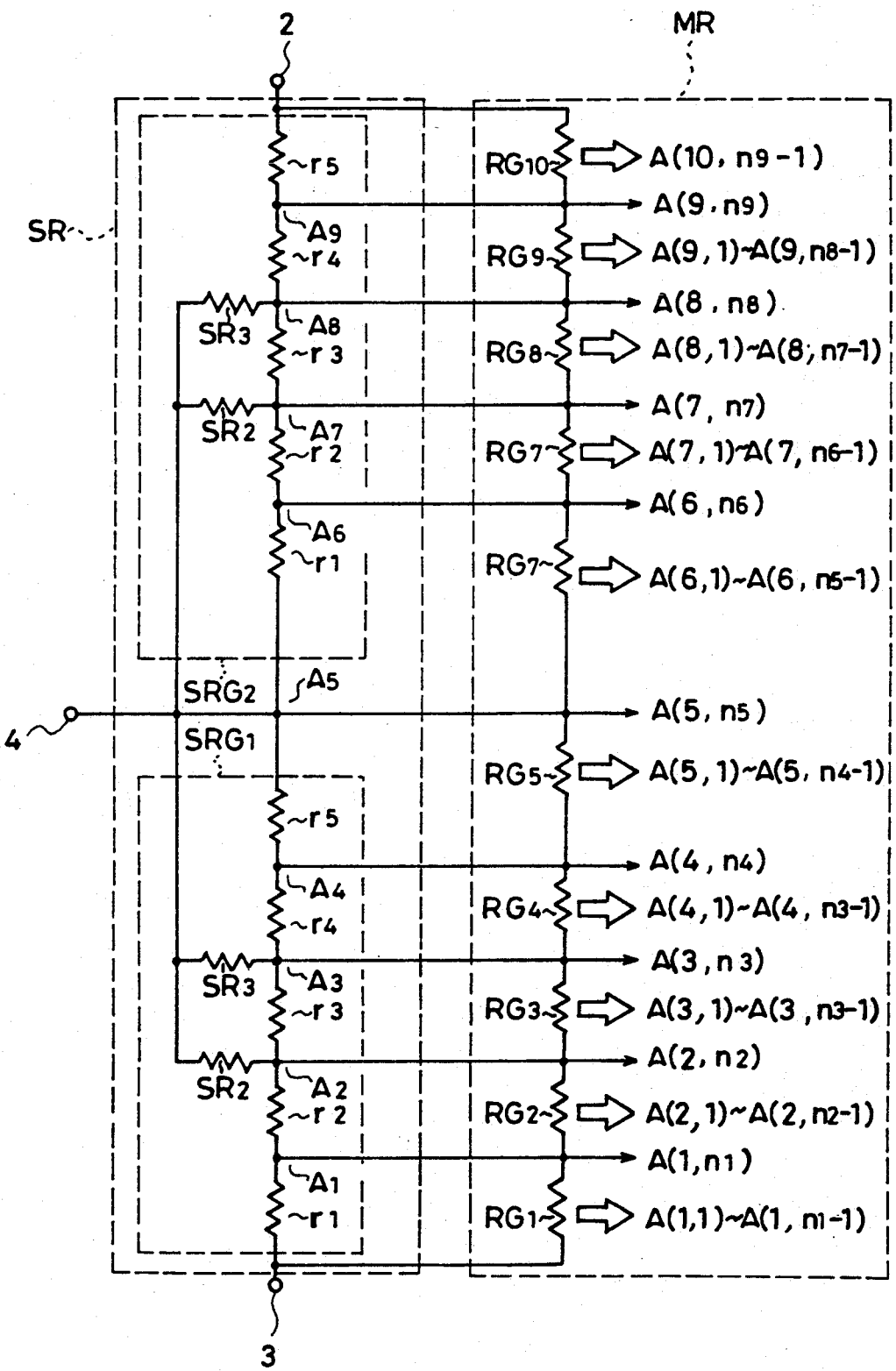

While in the embodiments described above, a voltage between reference voltage receiving terminals 2 and 3 is equally divided by the circuit shown in FIG. 1, the output voltages of the circuit need not be necessarily linear but may be non-linear. FIGS. 5(a) and 5(b) are circuit diagrams showing reference voltage generating circuits in such cases. The entire structure of the reference voltage generating circuit in this embodiment is the same as that shown in FIG. 3. In FIGS. 5(a) and 5(b), there are shown only the structure of sub-resistor network SR of FIG. 3. In FIGS. 5(a) and 5(b), "n1" represents the number of the resistor elements constituting the resistor network RG1 in the main resistor network MR and "n2" represents the number of the resistor elements constituting the resistor network RG2 in the main resistor network MR and ... and "nm" represents the number of the resistor elements constituting the resistor network RGm. FIG. 5(a) shows a case that references of output voltages of sub-resistor network SR become larger at locations closer to ends of sub-resistor network SR, and FIG. 5(b) shows a case that they become larger at locations closer to the center of sub-resistor network SR.

In the embodiment described below, a given sub-resistor network SRi in sub-resistor network SR connected to any of taps A2 to A(m−2) (see FIG. 1) is constituted of a single resistor element having a resistance value of 2·r and provided between the corresponding tap Ai and a reference voltage receiving terminal Bi for receiving any reference voltage. More specifically, as shown in FIG. 2, sub-resistor network SR is constituted of a series connection circuit of m resistors r1 to rm having the same resistance value r and provided between first reference voltage receiving terminal B1 and (m−1)th reference voltage receiving terminal B(m−1), and of resistors having a resistance value of 2·r and provided between all the other nodes than the two nodes closest to reference voltage receiving terminals B1 and B(m−1) out of the nodes between the resistors r1 to rm, and the remaining reference voltage receiving terminals B2 to B(m−2).

Referring to FIG. 2, when voltage Vbi of any magnitude is applied to reference voltage receiving terminal Bi, potential Vai at any output tap Ai in this circuit is found by the following expression.

when $i \neq 1, m-1$ $$Vai = \left\{ Vb1/2^{i-1} + \sum_{k=2}^{i-1}(Vbk/2^{i-k}) + \sum_{k=2}^{m-2}(Vbk/2^{k-1}) + Vb(m-1)/2^{m-2-1} \right\}/3 \quad (10)$$

when $i = 1$ $$Va1 = \left\{ 2Vb1 + \sum_{k=2}^{m-2}(Vbk/2^{k-1}) + Vb(m-1)/2^{m-3} \right\}/3 \quad (11)$$

when $i = m-1$ $$Va(m-1) = \left\{ Vb1/2^{m-3} + \sum_{k=2}^{m-2}(Vbk/2^{m-1-k}) + 2Vb(m-1) \right\}/3 \quad (12)$$

Referring to FIG. 5(a), this sub-resistor network SR is obtained by setting m to 7 in FIG. 2 and having reference voltage receiving terminals B1 to B3 connected to reference voltage receiving terminal 3 which receives a low reference voltage V3 and having the remaining reference voltage receiving terminals B4 to B6 connected to reference voltage receiving terminal 2 which receives a high reference voltage V2. In this case, potentials Va1 to Va6 developed at output taps A1 to A6 are given by the following expressions according to the above expressions (10) to (12).

$$Va1 = (V2-V3)/12 + V3 \quad (13)$$

$$Va2 = (V2-V3)/6 + V3 \quad (14)$$

$$Va3 = (V2-V3)/3 + V3 \quad (15)$$

$$Va4 = 2 \cdot (V2-V3)/3 + V3 \quad (16)$$

$$Va5 = 5 \cdot (V2-V3)/6 + V3 \quad (17)$$

$$Va6 = 11 \cdot (V2-V3)/12 + V3 \quad (18)$$

As can be understood from the expressions (13) to (18), the potential difference between output taps A3 and A4 located in the center of the sub-resistor network of the present embodiment is $(V2-V3)/3$. Meanwhile, both the potential differences between output taps A2 and A3 and output taps A4 and A5 closer to both ends are small, or $(V2-V3)/6$. Furthermore, the potential differences between output taps A1 and A2 and output taps A5 and A6 closest to both ends are even smaller, or $(V2-V3)/12$.

Figure 6:
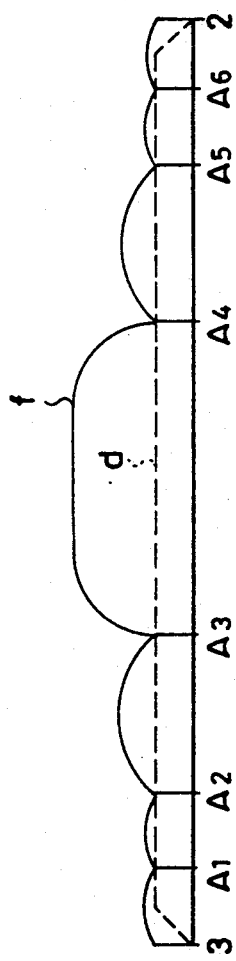
FIGS. 6 and 7 are diagrams showing relationships between the output impedance and the locations of output taps in the reference voltage generating circuits shown in FIGS. 5(a) and 5(b).
Figure 11:
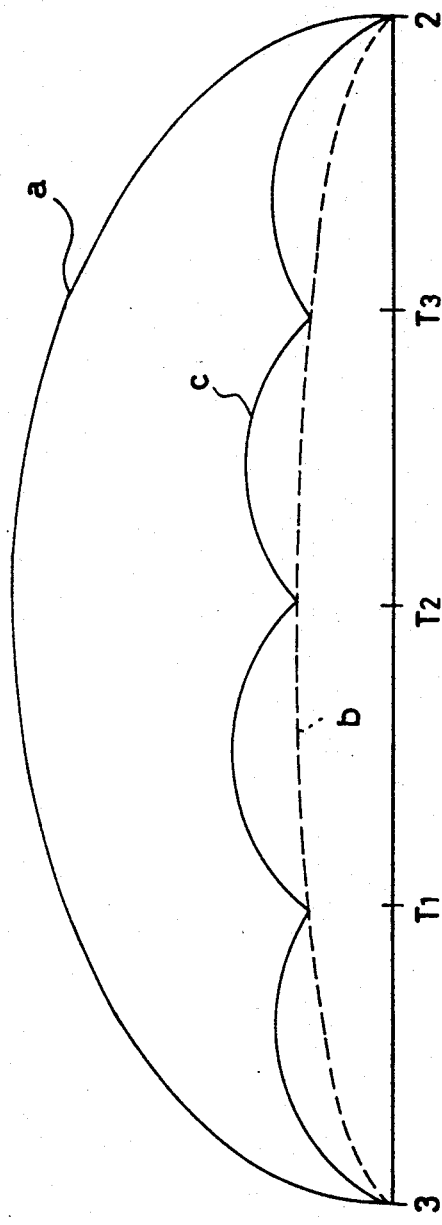
FIG. 11 is a diagram showing a relationship between the output impedance and the locations of output taps in a conventional reference voltage generating circuit.

FIG. 6 is a diagram showing, in the same manner as in FIGS. 4 and 11, a relationship between the output impedance and the locations of output taps in the reference voltage generating circuit of the present embodiment. Referring to FIG. 6, the output impedance of the sub-resistor network in the present embodiment represents the same value $(2 \cdot r/3)$ at any output tap of A1 to A6, as shown by the line d. Therefore, the output impedance of the main resistor network MR connected to this sub-resistor network represents the same value at those taps connected to output taps A1 to A6 of the sub-resistor network and varies only at the other taps that are not connected to output taps A1 to A6 of the sub-resistor network, depending on the locations of taps in the main resistor network.

Figure 5C:
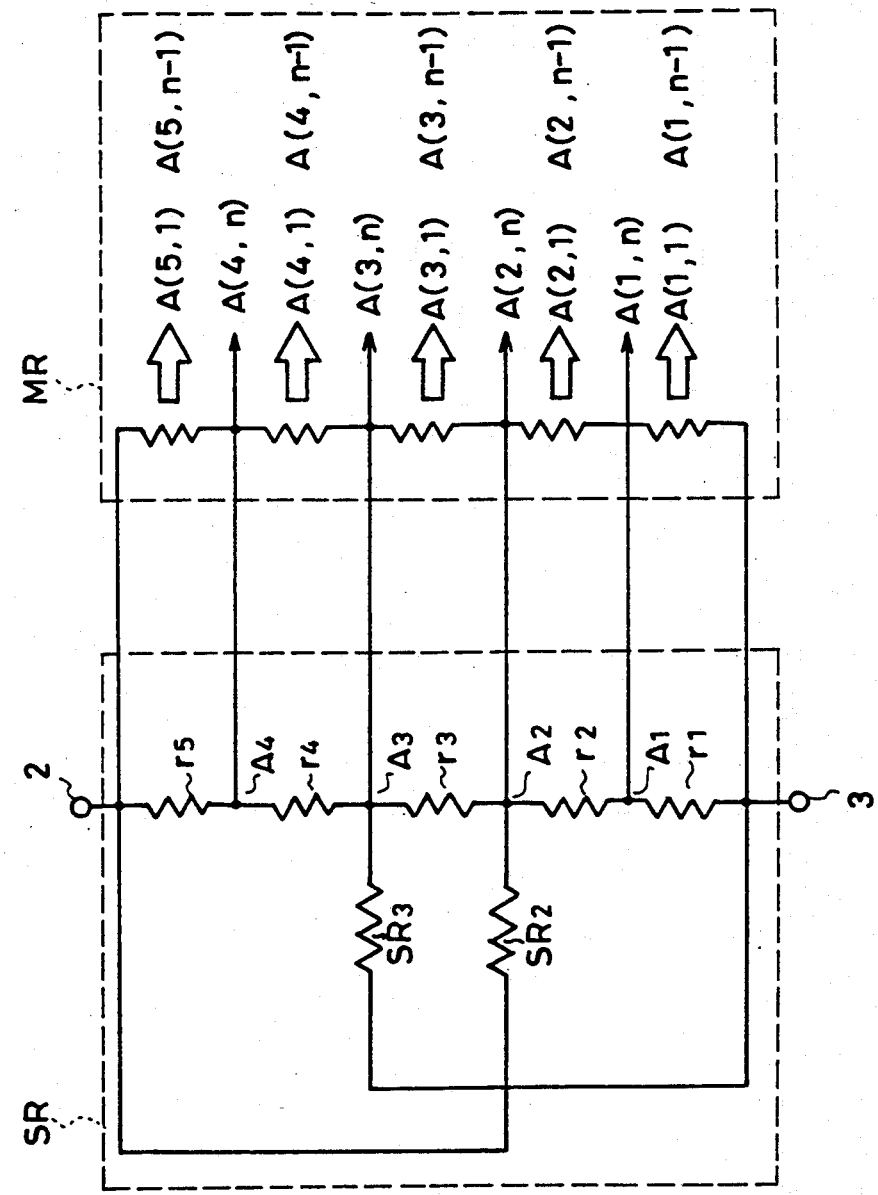

Further, it is also possible to obtain a plurality of linear output voltages from a sub-resistor network of such a structure. For example, such a sub-resistor network may be obtained by setting m to 5 in FIG. 2 and having reference voltage receiving terminals B1 and B3 connected to the above-mentioned reference voltage receiving terminal 3 and having the other reference voltage receiving terminals B2 and B4 connected to the above-mentioned reference voltage receiving terminal 2. FIG. 5(c) shows a circuit diagram of a reference voltage generating circuit in such a case and a still another embodiment of the present invention. Potentials Va1 to Va4 developed at the four output taps A1 to A4 of this sub-resistor network are given by the following expressions according to the above expressions (13) to (18).

$$Va1 = (V2-V3)/4 + V3 \quad (19)$$

$$Va2 = (V2-V3)/2 + V3 \quad (20)$$

$$Va3 = (V2-V3)/2 + V3 \quad (21)$$

$$Va4 = 3 \cdot (V2-V3)/4 + V3 \quad (22)$$

As can be understood from the expressions (19) to (22), in the sub-resistor network configured as described above, potential differences between the output taps can be made to represent the same value $(V2-V3)/4$. When the sub resistor network SR is structured to provide outputs of a plurality of linear voltages, the sub resistor network SR may be solely used as a reference voltage generating circuit.

In the embodiment of FIG. 5(a), potential differences between output taps of the sub-resistor network that are connected to a central portion of the main resistor network having a high impedance are larger than those corresponding to the end portions of the main resistor network. Conversely, however, it is also possible to make the potential differences between the taps of the sub-resistor network that correspond to the central portion of the main resistor network represent smaller values than those between the taps of the sub-resistor network corresponding to the end portions of the main resistor network. This is realized, for example, by providing sub-resistor networks between three reference voltage receiving terminals 2 to 4 receiving reference voltages of different magnitudes.

Referring to FIG. 5(b), a sub-resistor network is constituted of a series connection of a resistor network SRG1 provided between reference voltage receiving terminals 3 and 4 and another resistors networks RG2 provided between reference voltage receiving terminals 2 and 4. Each of resistor networks SRG1 and SRG2 is obtained by setting m to 5 and having reference voltage receiving terminals B1 to B3 and the remaining reference voltage receiving terminal B4 receive reference voltages of different magnitudes, in FIG. 2. In the present embodiment, reference voltage receiving terminal 3 receives a predetermined low reference voltage V3 and reference voltage receiving terminal 2 receives a predetermined reference voltage V2 higher than the low reference voltage V3. Reference voltage receiving terminal 4 receives a voltage of the intermediate magnitude between the low reference voltage V3 and the high reference voltage V2, or (V2+V3)/2. Outputs of this sub-resistor network SR are fetched from output taps A1 to A4 of resistor network SRG1 and output taps A6 to A9 of resistor network SRG2 and from the node A5 between resistor networks SRG2 and SRG1. Therefore, potentials Va1 to Va9 at the respective output taps A1 to A9 of the sub-resistor network SR are given by the following expressions according to the above expressions (10) to (12).

$$Va1 = (V2-V3)/4 + V3 \quad (23)$$

$$Va2 = 3 \cdot (V2-V3)/8 + V3 \quad (24)$$

$$Va3 = 7 \cdot (V2-V3)/16 + V3 \quad (25)$$

$$Va4 = 15 \cdot (V2-V3)/32 + V3 \quad (26)$$

$$Va5 = (V2-V3)/2 + V3 \quad (27)$$

$$Va6 = 17 \cdot (V2-V3)/32 + V3 \quad (28)$$

$$Va7 = 9 \cdot (V2-V3)/16 + V3 \quad (29)$$

$$Va8 = 5 \cdot (V2-V3)/8 + V3 \quad (30)$$

$$Va9 = 3 \cdot (V2-V3)/4 + V3 \quad (31)$$

As can be understood from the expressions (23) to (31), in this sub-resistor network, all potential differences between output taps A5 and A6, output taps A4 and A5, output taps A6 and A7 and output taps A3 and A4 in the central portion are (V2−V3)/32. Meanwhile, potential differences between output taps A2 and A3 and output taps A7 and A8 in the end portions are (V2−V3)/16, which is smaller than that between the taps in the central portion. Further, potential differences between output taps A1 and A2 and output taps A8 and A9 are even larger, or (V2−V3)/8. Thus, according to the present embodiment, potential differences between the output taps of the sub-resistor network become smaller at a portion closer to the center of sub-resistor network SR.

As has been previously described, when reference voltage receiving terminals 2 to 4 are all connected to ideal power sources, all the output taps A1 to A4 of resistor network SRG1 and all the output taps A6 to A9 of resistor network SRG2 have impedance of 2·r/3. However, the tap impedance at tap A5, or the node between resistor networks SRG1 and SRG2 is 0 since the node is connected to reference voltage receiving terminal 4. This sub-resistor network SR is connected to a main resistor network MR having the structure shown in FIG. 9. Accordingly, the output impedance of the reference voltage generating circuit of the present embodiment represents the same value 2·r/3 at those output taps of main resistor network MR that are connected to output taps A1 to A4 and A6 to A9 of sub-resistor network SR. Further, the output impedance of the reference voltage generating circuit varies only at the other output taps of main resistor network MR that are not connected to sub-resistor network SR (or those taps in main resistor network MR that correspond to the taps located between output taps A1 to A9 in sub-resistor network SR), depending on the locations of taps in main resistor network MR.

Figure 7:
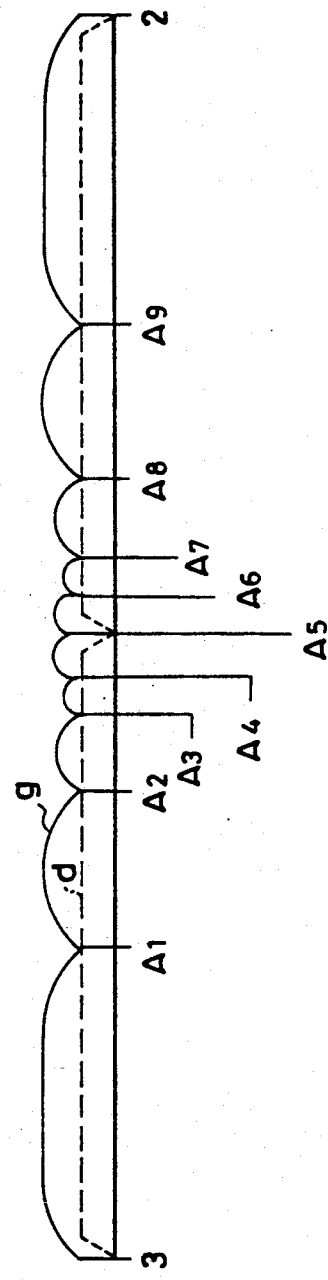

FIG. 7 is a diagram showing, in the same manner as in FIG. 6, a relation between the output impedance and the locations of taps in main resistor network MR of the reference voltage generating circuit according to the present embodiment. Referring to FIG. 7, the output impedance of the reference voltage generating circuit according to the present embodiment represents the same value 2·r/3 at all connection taps A1 to A9 between main resistor network MR and sub-resistor network SR, as shown by the curve g. Further, for the other parts than the above-mentioned connection taps, the output impedance represents maximum values at the centers between those connection taps. Meanwhile, the line d in FIG. 7 shows impedance of the sub-resistor network (FIG. 5(b)) in the present embodiment.

Thus, according to the present embodiment, it is possible to make the potential differences small that appear between the output taps of sub-resistor network SR which are connected to those parts of main resistor network MR having high output impedances.

Meanwhile, in any of the embodiments described above, the output tap impedance of sub-resistor network SR is set substantially lower than that of main resistor network MR to which the sub-resistor network SR is connected. As a result, as shown in FIGS. 6 and 7, dependency of the output impedance of the reference voltage generating circuit on the locations of taps is reduced as compared with the conventional cases, due to the sub-resistor network SR's independency of the locations of taps.

Further, in the embodiments shown in FIGS. 5(a) and (b), the relationship between output potentials of sub-resistor network SR is non-linear and therefore, main resistor network MR is constituted such that it divides the non-linear output potentials of sub-resistor network SR to have a linear relationship. Therefore, in any of those embodiments, the reference voltage generating circuit provides output potentials having a linear relationship. That is, in those embodiments, the numbers n1 to nm of and the resistance values of the resistor elements constituting the respective resistor networks GR1 to GRm are set such that a certain relationship can stand between the output voltages of main resistor network MR which can be represented by an inverse exponential function relative to that present between the output voltages of the sub-resistor network.

Furthermore, in these embodiments, the output impedance of sub-resistor network SR is set substantially small relative to that of main resistor network MR. However, when the output impedance of sub-resistor network SR can not be made so low, outputs of sub-resistor network SR may be applied to main resistor network MR through a buffer for conversion into low impedances.

Meanwhile, the reference voltage generating circuits of all the other embodiments than that shown in FIG. 1 can be applied to both A/D and D/A converters. Since these reference voltage generating circuits have also only small differences of impedances between the output taps, they can enhance performance of the A/D and D/A converters.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A reference voltage generating circuit comprising:
   a first reference voltage receiving terminal for receiving a first reference voltage;
   a second reference voltage receiving terminal for receiving a second reference voltage of a magnitude different from the magnitude of said first voltage;
   a plurality of main resistor elements connected in series to each other at nodes between said first and second reference voltage receiving terminals,
   each of said plurality of main resistor elements having the same resistance value; and
   a plurality of resistor networks, each of said resistor networks provided for a corresponding one of said nodes except the node closest to each of said first and second voltage receiving terminals;
   each of said resistor networks having a magnitude of output impedance equal to twice the resistance value of said main resistor element.

2. A reference voltage generating circuit as recited in claim 1, wherein each of said resistor networks comprises a first resistor and a second resistor connected in series at a connection point between said first and second reference voltage receiving terminals, each of said connection points being connected to a corresponding one of said nodes.

3. A reference voltage generating circuit comprising:
   a first reference voltage receiving terminal for receiving a first reference voltage;
   a second reference voltage receiving terminal for receiving a second reference voltage of a magnitude different from the magnitude of said first voltage;
   a plurality of main resistor elements connected in series to each other at nodes between said first and second reference voltage receiving terminals,
   each of said plurality of main resistor elements having the same resistance value; and
   a plurality of resistor networks, each of said resistor networks provided for a corresponding one of said nodes except the node closest to each of said first and second voltage receiving terminals;
   each of said resistor networks having a resistance value being equal to twice the resistance value of said main resistor element;
   each of said resistor networks being connected to the corresponding one of said nodes.

4. A reference voltage generating circuit comprising:
   a first reference voltage receiving terminal for receiving a first reference voltage;
   a second reference voltage receiving terminal for receiving a second reference voltage different from said first reference voltage;
   a main resistor network including a first plurality of main resistor elements connected in series to each other at nodes between said first and second reference voltage receiving terminals,
   said plurality of main resistor elements each having the same resistance value; and
   a sub-resistor network including a first plurality of sub-resistor elements connected in series to each other at junctions between said first and second reference voltage receiving terminals, said junctions connected to said nodes in a one-to-one correspondence,
   said first plurality of sub-resistor elements each having the same resistance value,
   said sub-resistor network further including a second plurality of sub-resistor elements each comprising first and second resistors connected in series with each other at connection points between said first and second reference voltage receiving terminals and having an output impedance of a magnitude equal to twice that of the resistance value of said first plurality of sub-resistor elements, each of said connection points corresponding to a respective one of said junctions other than the two junctions closest to said first and second reference voltage receiving terminals.

5. A reference voltage generating circuit comprising:
   a first reference voltage receiving terminal for receiving a first reference voltage;
   a second reference voltage receiving terminal for receiving a second reference voltage different from said first reference voltage;
   a reference voltage receiving means;
   a main resistor network having a plurality of main resistor elements connected in series to each other at nodes between said first and second reference voltage receiving terminals; and
   a sub-resistor network comprising a plurality of first sub-resistor elements connected in series to each other at said nodes in a one-to-one correspondence and between said first and second reference voltage receiving terminals, said sub-resistor network further comprising a plurality of second sub-resistor elements provided between all the nodes other than the two nodes closest to said first and second reference voltage receiving terminals, respectively, and said reference voltage receiving means,
   said plurality of first sub-resistor elements each having the same resistance value,
   the resistance value of each of said second sub-resistor elements being equal to twice that of said plurality of first sub-resistor elements.

6. The reference voltage generating circuit as recited in claim 5, wherein
   said reference voltage receiving means includes a number of receiving means terminals equal to the number of said second sub-resistor elements,
   said receiving means terminals corresponding to said second sub-resistor elements on a one-to-one basis,
   each of said second sub-resistor elements being connected between a corresponding one of said receiving means terminals and a corresponding node, and
   each of said receiving means terminals receiving a predetermined voltage as an additional reference voltage.

7. The reference voltage generating circuit as recited in claim 5, wherein
   said reference voltage receiving means includes a first receiving means terminal for receiving the same voltage as said first reference voltage and a second receiving means terminal for receiving the same voltage as said second reference voltage;
   the number of said first sub-resistor elements is 7;
   the four nodes other than the two nodes closest to said first and second reference voltage receiving terminals, respectively, out of the six nodes between said first sub-resistor elements includes first and second nodes closer to said first reference voltage receiving terminal and third and fourth nodes closer to said second reference voltage receiving terminal; and
   said second sub-resistor elements are connected between said first node and said first terminals, said second node and said first terminal, said third node and said second terminal, and said fourth node and said second terminal, respectively.

8. The reference voltage generating circuit as recited in claim 5, wherein
   said reference voltage receiving means is connected to one of said first and second reference voltages.

9. A reference voltage generating circuit comprising:
   a first reference voltage receiving terminal for receiving a first reference voltage;
   a second reference voltage receiving terminal for receiving a second reference voltage of a magnitude different from the magnitude of said first voltage;
   a plurality of main resistor elements connected in series to each other at nodes between said first and second reference voltage receiving terminals;
   each of said plurality of main resistor elements having the same resistance value; and
   a plurality of sub-resistor elements each connected between one of said first and second voltage receiving terminals and a corresponding one of said nodes except the node closest to each of said first and second voltage receiving terminals;
   each of said sub-resistor elements having a resistance value equal to twice the resistance value of said main resistor element.

10. A reference voltage generating circuit comprising:
    a first reference voltage receiving terminal for receiving a first reference voltage;
    a second reference voltage receiving terminal for receiving a second reference voltage of a magnitude different from the magnitude of said first voltage;
    a plurality of main resistor elements connected in series to each other at nodes between said first and second reference voltage receiving terminals;
    each of said plurality of main resistor elements having the same resistance value; and
    sub-resistor means having a plurality of first sub-resistor elements and a plurality of second sub-resistor elements, said plurality of first sub-resistor elements connected in series with each other at nodes connected to corresponding nodes of said main resistor elements, each of said plurality of first sub-resistor elements having the same resistance value;
    said plurality of second sub-resistor elements each connected between one of said first and second voltage receiving terminals and a corresponding one of said nodes of said first sub-resistor elements except the node closest to each of said first and second voltage receiving terminals;
    each of said second sub-resistor elements having twice the resistance value of said first sub-resistor element.

11. The reference voltage generating circuit as recited in claim 10, wherein
    a first plurality of said second sub-resistor elements each connected between said first voltage receiving terminal and a corresponding one of said nodes of said first sub-resistor elements except the nodes closest to each of said first and second voltage receiving terminals; and
    a second plurality of said second sub-resistor elements each connected between said second voltage receiving terminal and a corresponding one of said nodes of said first sub-resistor elements except the nodes closest to each of said first and second voltage receiving terminals.

12. The reference voltage generating circuit as recited in claim 10 wherein
    a first plurality of said second sub-resistor elements each connected between said first voltage receiving terminal and a corresponding one of said nodes of said first sub-resistor elements on the side of said first voltage receiving terminal; and
    a second plurality of said second sub-resistor elements each connected between said second voltage receiving terminal and a corresponding one of said nodes of said first sub-resistor elements on the side of said second voltage receiving terminal.

13. A reference voltage generating circuit comprising:
    a first reference voltage receiving terminal for receiving a first reference voltage;
    a second reference voltage receiving terminal for receiving a second reference voltage different from said first reference voltage;
    a third reference voltage receiving terminal for receiving a third reference voltage equal to an intermediate value between said first and second reference voltages;
    a main resistor network provided between said first and second reference voltage receiving terminals; and
    first and second sub-resistor networks connected in series between said first and second reference voltage receiving terminals, wherein
    said first sub-resistor network includes:
    a plurality of first resistor elements connected in series to each other at nodes between said first and third reference voltage receiving terminals and having the same resistance value; and second resistor elements connected between all the nodes other than the two nodes closest to said first and third reference voltage receiving terminals, respectively, out of the nodes between said plurality of first resistor elements, and said third reference voltage receiving terminal, said second sub-resistor network includes:

a plurality of third resistor elements connected in series to each other at nodes between said second and third reference voltage receiving terminals and having the same resistance value as that of said first resistor elements; and fourth resistor elements connected between all the nodes other than the two nodes closest to said second and third reference voltage receiving terminals, respectively, out of the nodes between said plurality of third resistor elements, and said third reference voltage receiving terminal, said main resistor network includes resistor networks connected in series to each other at nodes between said first and second reference voltage receiving terminals, the number of which is equal to the sum of the number of said first resistor elements and the number of said third resistor elements, the nodes between said resistor networks in said main resistor network are connected to the nods between said first resistor elements in said first sub-resistor network and the nodes between said third resistor elements in said second sub-resistor networks and to the node between said first and second sub-resistor networks in a one-to-one correspondence, and said second and fourth resistor elements have resistance values twice those of said first and third resistor elements, respectively.

14. A reference voltage generating circuit comprising:

a first reference voltage receiving terminal for receiving a first reference voltage;

a second reference voltage receiving terminal for receiving a second reference voltage of a magnitude different from the magnitude of said first voltage;

a plurality of main resistor elements connected in series to each other at nodes between said first and second reference voltage receiving terminals;

each of said plurality of main resistor elements having the same resistance value; and sub resistor means having a plurality of first sub resistor elements and a plurality of second sub resistor elements, said plurality of first sub resistor elements connected in series with each other at nodes connected to corresponding nodes of said main resistor elements, each of said plurality of first sub resistor elements having the same resistance value;

said plurality of second sub resistor elements each connected between a third reference voltage receiving terminal, which has a voltage level intermediate the voltage level at said first and second voltage receiving terminals, and a corresponding one of said nodes of said first sub resistor elements except the node closest to each of said first and second voltage receiving terminals;

each of said second sub resistor elements having twice the resistance value of said first sub resistor element.

15. An A/D converter for converting an analog signal to a digital signal comprising:

analog voltage generating means for generating a plurality of different analog voltages;

comparison means provided each coupled to one of said plurality of different analog voltages for comparing each of said plurality of different analog voltages generated by said analog voltage generating means with an externally applied analog voltage which is to be converted into a digital signal; and digital signal producing means for producing, based on the comparison results of said comparison means, a digital signal corresponding to said externally applied analog voltage in a predetermined form, wherein said analog voltage generating means comprises:

a first reference voltage receiving terminal for receiving a first reference voltage;

a second reference voltage receiving terminal for receiving a second reference voltage of a magnitude different from that of said first reference voltage;

a plurality of resistor elements connected in series between said first and second reference voltage receiving terminals, said plurality of resistor elements having the same resistance value; and resistor networks provided each corresponding to one of all the nodes other than the two nodes closest to said first and second reference voltage receiving terminals, respectively, out of the nodes between said plurality of resistor elements, each of said resistor networks having first and second resistor elements connected in series between said first and second reference voltage receiving terminals and having an output impedance of a magnitude equal to twice that of the resistance value of said plurality of resistor elements, and each of all the said nodes being connected to the node between said first and second resistor elements constituting a corresponding one of said resistor networks.

16. The A/D converter as recited in claim 15, wherein said comparison means comprises:

first input terminal for receiving a corresponding one of said analog voltages;

second input terminal for receiving said externally applied analog voltage;

an output terminal;

capacitor means;

first switching means provided between said first input terminal and one terminal of said capacitor means;

second switching means provided between said second input terminal and said one terminal of said capacitor means; and third switching means and invertor means connected in parallel between the other terminal of said capacitor means and said output terminal, said first and third switching means and said second switching means are complementarily turned on/off.

17. An A/D converter for converting an analog signal to a digital signal comprising:

analog voltage generating means for generating a plurality of different analog voltages;

comparison means provided each corresponding to one of said plurality of different analog voltages for comparing each of said plurality of different analog voltages generated by said analog voltage generating means with an externally applied analog voltage which is to be converted into a digital signal; and digital signal producing means for producing, based on the comparison results of said comparison means, a digital signal corresponding to said externally applied analog voltage in a predetermined form, wherein said analog voltage generating means comprises:
a first reference voltage receiving terminal for receiving a first reference voltage;
a second reference voltage receiving terminal for receiving a second reference voltage different from said first reference voltage;
a main resistor network including a first plurality of main resistor elements connected in series to each other at nodes between said first and second reference voltage receiving terminals,
said plurality of main resistor elements each having the same resistance value; and
a sub-resistor network including a first plurality of sub-resistor elements connected in series to each other at junctions between said first and second reference voltage receiving terminals, said junctions connected to said nodes in a one-to-one correspondence,
said first plurality of sub-resistor elements each having the same resistance value, said sub-resistor network further including a second plurality of sub-resistor elements each comprising first and second resistors connected in series with each other at connection points between said first and second reference voltage receiving terminals and having an output impedance of a magnitude equal to twice that of the resistance value of said first plurality of sub-resistor elements, each of said connection points corresponding to a respective one of said junctions other than the two junctions closest to said first and second reference voltage receiving terminals.

18. An A/D converter for converting an analog signal to a digital signal comprising:
analog voltage generating means for generating a plurality of different analog voltages;
comparison means provided each corresponding to one of said plurality of different analog voltages for comparing each of said plurality of different analog voltages generated by said analog voltage generating means with an externally applied analog voltage which is to be converted into a digital signal; and
digital signal producing means for producing, based on the comparison results of said comparison means, a digital signal corresponding to said externally applied analog voltage in a predetermined form, wherein
said analog voltage generating means comprises:
a first reference voltage receiving terminal for receiving a first reference voltage;
a second reference voltage receiving terminal for receiving a second reference voltage different from said first reference voltage and a reference voltage receiving means;
a main resistor network having a plurality of main resistor elements connected in series to each other at nodes between said first and second reference voltage receiving terminals; and
a sub-resistor network comprising a plurality of first sub-resistor elements connected in series to each other at said nodes in a one-to-one correspondence and between said first and second reference voltage receiving terminals, said sub-resistor network further comprising a plurality of second sub-resistor elements provided between all the nodes other than the two nodes closest to said first and second reference voltage receiving terminals, respectively, and said reference voltage receiving means,
said plurality of first sub-resistor elements each having the same resistance value,
the resistance value of each of said second sub-resistor elements being equal to twice that of said plurality of first sub-resistor elements.

19. The A/D converter as recited in claim 18, wherein
said reference voltage receiving means includes a number of receiving means terminals equal to the number of said second sub-resistor elements,
said receiving means terminals corresponding to said second sub-resistor elements on a one-to-one basis,
each of said second sub-resistor elements being connected between a corresponding one of said receiving means terminals and a corresponding node, and
each of said receiving means terminals receiving a predetermined voltage as an additional reference voltage.

20. The A/D converter as recited in claim 18, wherein:
said reference voltage receiving means includes a first receiving means terminal for receiving the same voltage as said first reference voltage and a second receiving means terminal for receiving the same voltage as said second reference voltage;
the number of said first sub-resistor elements is 7;
the four nodes other than the two nodes closest to said first and second reference voltage receiving terminals, respectively, out of the six nodes between said first sub-resistor elements includes first and second nodes closer to said first reference voltage receiving terminal and third and fourth nodes closer to said second reference voltage receiving terminal; and
said second sub-resistor elements are connected between said first node and said first terminal, said second node and said first terminal, said third node and said second terminal, and said fourth node and said second terminal, respectively.

21. The A/D converter as recited in claim 18, wherein
said reference voltage receiving means is connected to one of said first and second reference voltages.

22. An A/D converter for converting an analog signal to a digital signal comprising:
analog voltage generating means for generating a plurality of different analog voltages;
comparison means provided each corresponding to one of said plurality of different analog voltages for comparing each of said plurality of different analog voltages generated by said analog voltage generating means with an externally applied analog voltage which is to be converted into a digital signal; and digital signal producing means for producing, based on the comparison results of said comparison means, a digital signal corresponding to said externally applied analog voltage in a predetermined form, wherein said analog voltage generating means comprises:

a first reference voltage receiving terminal for receiving a first reference voltage;

a second reference voltage receiving terminal for receiving a second reference voltage different from said first reference voltage;

a third reference voltage receiving terminal for receiving a third reference voltage equal to an intermediate value between said first and second reference voltages;

a main resistor network provided between said first and second reference voltage receiving terminals; and first and second sub-resistor networks connected in series between said first and second reference voltage receiving terminals, said first sub-resistor network including:

a plurality of first resistor elements connected in series to each other at nodes between said first and third reference voltage receiving terminals and having the same resistance value; and second resistor elements connected between all the nodes other than the two nodes closest to said first and third reference voltage receiving terminals, respectively, out of the nodes between said plurality of first resistor elements, and said third reference voltage receiving terminal, said second sub-resistor network including:

a plurality of third resistor elements connected in series to each other at nodes between said second and third reference voltage receiving terminals and having the same resistance value as that of said first resistor elements; and fourth resistor elements connected between all the nodes other than the two nodes closest to said second and third reference voltage receiving terminals, respectively, out of the nodes between said plurality of third resistor elements, and said third reference voltage receiving terminal, said main resistor network including resistor networks connected in series to each other at nodes between said first and second reference voltage receiving terminals, the number of which is equal to the sum of the number of said first resistor elements and the number of said third resistor elements, the nodes between said resistor networks in said main resistor network being connected to the nodes between said first resistor elements in said first sub-resistor network and the nodes between said third resistor elements in said second sub-resistor network and to the node between said first and second sub-resistor networks in a one-to-one correspondence, and said second and fourth resistor elements have resistance values twice those of said first and third resistor elements, respectively.

23. The A/D converter as recited in claim 22, wherein said comparison means comprises:

a first input terminal for receiving a corresponding one of said analog voltages;

a second input terminal for receiving said externally applied analog voltage;

an output terminal;

capacitor means;

first switching means provided between said first input terminal and one terminal of said capacitor means;

second switching means provided between said second input terminal and said one terminal of said capacitor means; and third switching means and invertor means connected in parallel between the other terminal of said capacitor means and said output terminal, said first and third switching means and said second switching means are complementarily turned on/off.

24. A D/A converter for converting a digital signal to an analog signal comprising:

analog voltage generating means for generating a plurality of different analog voltages;

decoding means for decoding a digital signal which is to be converted into an analog voltage; and means for selectively outputting, in response to the decoded output of said decoding means, one of said plurality of different analog voltages generated by said analog voltage output means that corresponds to said digital signal, wherein said analog voltage output means comprises:

a first reference voltage receiving terminal for receiving a first reference voltage;

a second reference voltage receiving terminal for receiving a second reference voltage of a magnitude different from that of said first reference voltage;

a plurality of resistor elements connected in series between said first and second reference voltage receiving terminals, said plurality of resistor elements having the same resistance value; and resistor networks provided each corresponding to one of all the nodes other than the two nodes closest to said first and second reference voltage receiving terminals, respectively, out of the nodes between said plurality of resistor elements, each of said resistor networks having first and second resistor elements connected in series between said first and second reference voltage receiving terminals and having an output impedance of a magnitude equal to twice that of the resistance value of said plurality of resistor elements, and each of all the said nodes being connected to the node between said first and second resistor elements constituting a corresponding one of said resistor networks.

25. A D/A converter for converting a digital signal to an analog signal comprising:

analog voltage output means for outputting a plurality of different analog voltages;

decoding means for decoding a digital signal which is to be converted into an analog voltage; and means for selectively outputting, in response to the decoded output of said decoding means, one of said plurality of different analog voltages generated by said analog voltage output means that corresponds to said digital signal, wherein said analog voltage generating means comprises:

a first reference voltage receiving terminal for receiving a first reference voltage;

a second reference voltage receiving terminal for receiving a second reference voltage different from said first reference voltage; the two junctions closest to said first and second reference voltage receiving terminals.

26. A D/A converter for converting a digital signal to an analog signal comprising:
   analog voltage output means for outputting a plurality of different analog voltages;
   decoding means for decoding a digital signal which is to be converted into an analog voltage; and
   means for selectively outputting, in response to the decoded output f said decoding means, one of said plurality of different analog voltages generated by said analog voltage output means that corresponds to said digital signal, wherein
   said analog voltage generating means comprises:
   a first reference voltage receiving terminal for receiving a first reference voltage;
   a second reference voltage receiving terminal for receiving a second reference voltage different from said first reference voltage and a reference voltage receiving means;
   a main resistor network having a plurality of main resistor elements connected in series to each other at nodes
   a main resistor network including a first plurality of main resistor elements connected in series to each other at nodes between said first and second reference voltage receiving terminals,
   said plurality of main resistor elements each having the same resistance value; and
   a sub-resistor network including a first plurality of sub-resistor elements connected in series to each other at junctions between said first and second reference voltage receiving terminals, said junctions connected to said nodes in a one-to-one correspondence,
   said first plurality of sub-resistor elements each having the same resistance value,
   said sub-resistor network further including a second plurality of sub-resistor elements each comprising first and second resistors connected in series with each other at connection points between said first and second reference voltage receiving terminals and having an output impedance of a magnitude equal to twice that of the resistance value of said first plurality of sub-resistor elements, each of said connection points corresponding to a respective one of said junctions other than between said first and second reference voltage receiving terminals; and
   a sub-resistor network comprising a plurality of first sub-resistor elements connected in series to each other at said nodes in a one-to-one correspondence and between said first and second reference voltage receiving terminals, said sub-resistor network further comprising a plurality of second sub-resistor elements provided between all the nodes other than the two nodes closest to said first and second reference voltage receiving terminals, respectively, and said reference voltage receiving means,
   said plurality of first sub-resistor elements each having the same resistance value,
   the resistance value of each of said second sub-resistor elements being equal to twice that of said plurality of first sub-resistor elements.

27. The D/A converter as recited in claim 26, wherein
   said reference voltage receiving means includes a number of receiving means terminals equal to the number of said second sub-resistor elements,
   said receiving means terminals corresponding to said second sub-resistor elements on a one-to-one basis,
   each of said second sub-resistor elements being connected between a corresponding one of said receiving means terminals and a corresponding node, and
   each of said receiving means terminals receiving a predetermined voltage as an additional reference voltage.

28. The D/A converter as recited in claim 26, wherein
   said reference voltage receiving means includes a first receiving means terminal for receiving the same voltage as said first reference voltage and a second receiving means terminal for receiving the same voltage as said second reference voltage;
   the number of said first sub-resistor elements is 7;
   the four nodes other than the two nodes closest to said first and second reference voltage receiving terminals, respectively, out of the six nods between said first sub-resistor elements includes first and second nodes closer to said first reference voltage receiving terminal and third and fourth nodes closer to said second reference voltage receiving terminal; and
   said second sub-resistor elements are connected between said first node and said first terminal, said second node and said first terminal, said third node and said second terminal, and said fourth node and said second terminal, respectively.

29. The D/A converter as recited in claim 26, wherein
   said reference voltage receiving means is connected to one of said first and second reference voltages.

30. A D/A converter for converting a digital signal to an analog signal comprising:
   analog voltage output means for outputting a plurality of different analog voltages:
   decoding means for decoding a digital signal which is to be converted into an analog voltage; and
   means for selectively outputting, in response to the decoded output of said decoding means, one of said plurality of different analog voltages generated by said analog voltage output means that corresponds to said digital signal, wherein
   said analog voltage generating means comprises:
   a first reference voltage receiving terminal for receiving a first reference voltage;
   a second reference voltage receiving terminal for receiving a second reference voltage different from said first reference voltage;
   a third reference voltage receiving terminal for receiving a third reference voltage equal to an intermediate value between said first and second reference voltages;
   a main resistor network provided between said first and second reference voltage receiving terminals; and
   first and second sub-resistor networks connected in series between said first and second reference voltage receiving terminals, wherein
   said first sub-resistor network includes:
   a plurality of first resistor elements connected in series to each other at noes between said first and third reference voltage receiving terminals and having the same resistance value; and second resistor elements connected between all the nodes other than the two nodes closest to said first and third reference voltage receiving terminals, respectively, out of the nodes between said plurality of first resistor elements, and said third reference voltage receiving terminal, said second sub-resistor network including:

a plurality of third resistor elements connected in series to each other at nodes between said second and third reference voltage receiving terminals and having the same resistance value as that of said first resistor elements; and fourth resistor elements connected between all the nodes other than the two nodes closest to said second and third reference voltage receiving terminals, respectively, out of the nodes between said plurality of third resistor elements, and said third reference voltage receiving terminal, said main resistor network including resistor networks connected in series to each other at nodes between said first and second reference voltage receiving terminals, the number of which is equal to the sum of the number of said first resistor elements and the number of said third resistor elements, the nodes between said resistor networks in said main resistor network are connected to the nodes between said first resistor elements in said first sub-resistor network and the nodes between said third resistor elements in said second sub-resistor networks and to the node between said first and second sub-resistor networks in a one-to-one correspondence; and said second and fourth resistor elements have resistance values twice those of said first and third resistor elements, respectively.

* * * * *